(12) United States Patent
Navarro Y Koren et al.

(10) Patent No.: US 6,844,918 B2
(45) Date of Patent: Jan. 18, 2005

(54) ALIGNMENT SYSTEM AND METHODS FOR LITHOGRAPHIC SYSTEMS USING AT LEAST TWO WAVELENGTHS

(75) Inventors: Ramon Navarro Y Koren, Veldhoven (NL); Hubertus Johannes Gertrudus Simons, Venlo (NL); Andre Bernardus Jeunink, Bergeyk (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/665,364

(22) Filed: Sep. 22, 2003

(65) Prior Publication Data

US 2004/0130690 A1 Jul. 8, 2004

Related U.S. Application Data
(60) Provisional application No. 60/411,861, filed on Sep. 20, 2002, and provisional application No. 60/413,601, filed on Sep. 26, 2002.

(30) Foreign Application Priority Data

Apr. 1, 2003 (EP) ............................................. 03075954
May 12, 2003 (EP) ............................................. 03076422

(51) Int. Cl.[7] ........................... G03B 27/42; G03B 27/52
(52) U.S. Cl. ......................................... 355/53; 355/55
(58) Field of Search ...................... 355/53, 55, 67–71; 250/548; 356/399–401

(56) References Cited

U.S. PATENT DOCUMENTS

| 4,037,969 A | 7/1977 | Feldman et al. |
|---|---|---|
| 4,251,160 A | 2/1981 | Bouwhuis et al. |
| 4,326,805 A | 4/1982 | Feldman et al. |
| 4,355,892 A | 10/1982 | Mayer et al. |
| 4,398,824 A | 8/1983 | Feldman et al. |
| 4,514,858 A | 4/1985 | Novak |
| 4,540,277 A | 9/1985 | Mayer et al. |
| 4,614,432 A | 9/1986 | Kuniyoshi et al. |
| 4,690,529 A | 9/1987 | Sugiyama et al. |
| 4,710,026 A | 12/1987 | Magome et al. |
| 4,748,333 A | 5/1988 | Mizutani et al. |
| 4,778,275 A | 10/1988 | van den Brink et al. |
| 4,814,829 A | 3/1989 | Kosugi et al. |
| 4,828,392 A | 5/1989 | Nomura et al. |
| 4,857,744 A | 8/1989 | Kataoka et al. |

(List continued on next page.)

FOREIGN PATENT DOCUMENTS

JP        11-329914        11/1999

OTHER PUBLICATIONS

Markle, D. A., "Submicron 1:1 Optical Lithography", Semi-conductor International, pp. 173–142, May 1986.

Primary Examiner—Henry Hung Nguyen
(74) Attorney, Agent, or Firm—Pillsbury Winthrop LLP

(57) ABSTRACT

An alignment system for a lithographic apparatus has a source of alignment radiation that has a first wavelength and a second wavelength; a detection system that has a first wavelength channel arranged to receive alignment radiation from an alignment mark at the first wavelength and a second wavelength channel arranged to receive alignment radiation from the alignment mark at the second wavelength; and a position determining unit in communication with the detection system. The position determining unit processes information from the first and second wavelength channels in combination to determine a position of the alignment mark based on information from the first wavelength channel, information from the second wavelength channel or combined information from the first and second wavelength channels according to a relative strength of the alignment radiation detected at the first wavelength to alignment radiation detected at the second wavelength. A lithographic apparatus includes the above alignment system. Methods of alignment and manufacturing devices use the above alignment system and lithographic apparatus, respectively.

137 Claims, 12 Drawing Sheets

U.S. PATENT DOCUMENTS

| | | | |
|---|---|---|---|
| 4,861,162 A | 8/1989 | Ina | |
| 4,870,452 A | 9/1989 | Tanimoto et al. | |
| 4,952,970 A | 8/1990 | Suzuki et al. | |
| 5,100,237 A | 3/1992 | Wittekoek et al. | |
| 5,114,236 A | 5/1992 | Matsugu et al. | |
| 5,118,953 A | 6/1992 | Ota et al. | |
| 5,144,363 A | 9/1992 | Wittekoek et al. | |
| 5,151,754 A | 9/1992 | Ishibashi et al. | |
| 5,160,849 A | 11/1992 | Ota et al. | |
| 5,243,195 A | 9/1993 | Nishi | |
| 5,347,356 A | 9/1994 | Ota et al. | |
| 5,381,210 A * | 1/1995 | Hagiwara | 355/53 |
| 5,418,613 A | 5/1995 | Matsutani | |
| 5,477,057 A | 12/1995 | Angeley et al. | |
| 5,488,230 A | 1/1996 | Mizutani et al. | |
| 5,489,986 A | 2/1996 | Magome et al. | |
| 5,543,921 A | 8/1996 | Uzawa et al. | |
| 5,559,601 A | 9/1996 | Gallatin et al. | |
| 5,596,204 A | 1/1997 | Irie et al. | |
| 5,674,650 A | 10/1997 | Dirksen et al. | |
| 5,801,390 A | 9/1998 | Shiraishi | |
| 5,808,910 A | 9/1998 | Irie et al. | |
| 5,910,847 A | 6/1999 | Van der Werf et al. | |
| 5,920,376 A | 7/1999 | Bruckstein et al. | |
| 5,920,378 A | 7/1999 | Murakami et al. | |
| 5,995,198 A * | 11/1999 | Mizutani | 355/53 |
| 6,034,378 A | 3/2000 | Shiraishi | |
| 6,133,641 A | 10/2000 | Hamada et al. | |
| 6,160,622 A * | 12/2000 | Dirksen et al. | 356/401 |
| 6,233,494 B1 | 5/2001 | Aoyagi | |
| 6,242,754 B1 | 6/2001 | Shiraishi et al. | |
| 6,285,455 B1 * | 9/2001 | Shiraishi | 356/486 |
| 6,297,876 B1 | 10/2001 | Bornebroek | |
| 6,420,791 B1 | 7/2002 | Huang et al. | |
| 2002/0158193 A1 | 10/2002 | Sezginer et al. | |
| 2003/0002043 A1 | 1/2003 | Abdulhalim et al. | |
| 2004/0114143 A1 | 6/2004 | Van Haren et al. | |
| 2004/0129900 A1 | 7/2004 | Den Boef et al. | |

\* cited by examiner

ALIGNMENT SYSTEM AND METHODS FOR LITHOGRAPHIC SYSTEMS USING AT LEAST TWO WAVELENGTHS

The present application claim priority to U.S. Provisional Application No. 60/411,861, filed Sep. 20, 2002, U.S. Provisional Application No. 60/413,601, filed Sep. 26, 2002, European Application No. 03075954.2, filed Apr. 1, 2003 and European Application No. 03076422.9, filed May 12, 2003. The entire contents of these application are incorporated herein by reference.

BACKGROUND OF THE INVENTION

1. Field of Invention

This invention relates to an alignment system for a lithographic apparatus, and a lithographic apparatus having such an alignment system, and more particularly to an alignment system that can detect the position of an alignment mark using at least two separate wavelength signals.

2. Discussion of Related Art

Lithographic apparatuses are essential components for the manufacture of integrated circuits and/or other microdevices. With the aid of such an apparatus, different mask patterns are successively imaged at a precisely aligned position onto a substrate such as a semiconductor wafer or an LCD panel. The substrate may undergo physical and chemical changes between the successive images that have been aligned with each other. The substrate is removed from the apparatus after it has been exposed with the image of a at least one mask pattern, and, after it has undergone the desired process steps, the substrate is placed back in order to expose it with an image of a further mask pattern, and so forth, while it must be ensured that the images of the further mask pattern and the subsequent mask patterns are positioned accurately with respect to theat least one already exposed image on the substrate. To this end, the lithographic apparatus is provided with an alignment system with which alignment marks on the substrate are aligned with respect to alignment marks on the mask.

A lithographic apparatus may not only be used for the manufacture of ICs but also for the manufacture of other structures having detailed dimensions of the order of 1 micrometer, or smaller. Examples are structures of integrated, or plenary, optical systems or guiding and detection patterns of magnetic domain memories, micro-electromechanical systems (MEMS), and structures of liquid crystal display panels. Also in the manufacture of these structures, images of mask patterns must be aligned very accurately with respect to images already exposed onto the substrate.

The lithographic apparatus may be a stepping apparatus or a step-and-scan apparatus. In a stepping apparatus, the mask pattern is imaged in one shot on an exposure area of the substrate. Subsequently, the substrate is moved with respect to the mask in such a way that a subsequent exposure area will be situated under the mask pattern and the projection lens system and the mask pattern is imaged on the subsequent exposure area. This process is repeated until all exposure areas of the substrate are provided with a mask pattern image. In a step-and-scan apparatus, the above-mentioned stepping procedure is also followed, but the mask pattern is not imaged in one shot, but via scanning movement. During imaging of the mask pattern, the substrate is moved synchronously with the mask with respect to the projection system and the projection beam, taking the magnification of the projection system into account. A series of juxtaposed partial images of consecutively exposed parts of the mask pattern is imaged in an exposure area. After the mask pattern has been completely imaged in an exposure area, a step is made to a subsequent exposure area. A possible scanning procedure is described in the article: "Sub-micron 1:1 Optical Lithography" by D. A. Markle in the magazine "Semiconductors International" of May 1986, pp. 137–142.

U.S. Pat. No. 5,243,195 discloses an optical lithographic apparatus provided with an alignment system and intended for the manufacture of ICs. This alignment system comprises an off-axis alignment unit for aligning a substrate alignment mark with respect to this alignment unit. In addition, this alignment system comprises a second alignment unit for aligning a substrate mark with respect to a mask mark via the projection lens (TTL). Alignment via the projection lens (on-axis alignment) is frequently used in many current generation of optical lithographic appalithographic apparatuses and provides the advantage that the substrate and the mask can be aligned directly with respect to each other. When the off-axis alignment method is used, the baseline offset as described in U.S. Pat. No. 5,243,195 must be taken into account. However, with the continued decrease in the size of components on ICs and the increase in complexity, on-axis alignment systems have proven to be difficult to improve sufficiently to achieve the required precision and accuracy.

In connection with the increasing number of electronic components per unit of surface area of the substrate and the resultant smaller dimensions of these components, increasingly stricter requirements are imposed on the accuracy with which integrated circuits are made. The positions where the successive masks are imaged on the substrate must therefore be fixed more and more accurately. In the manufacture of new-generation ICs with smaller line widths, the alignment accuracy will have to be improved or, in other words, it must be possible to detect smaller deviations so that the resolving power of the alignment system must be increased. On the other hand, stricter requirements must also be imposed on the flatness of the substrate due to the required higher numerical aperture (NA) of the projection lens system in the case of decreasing line widths. The depth of focus of this system decreases as the NA increases. Since some image field curvature occurs at the desired relatively large image field of the projection lens system, there is hardly any room left for unevenness of the substrate. To obtain the desired flatness of the substrate, it has been proposed to polish the substrate by a chemical mechanical polishing (CMP) process between two consecutive exposures with different mask patterns in the lihographic apparatus. However, this polishing process affects the accuracy of the on-axis alignment method. In this method, a grating is used as a substrate alignment mark and the sub-beams diffracted in the first order by this grating are used for imaging the substrate mark on the mask mark. In this process, it is assumed that the substrate is aligned correctly with respect to the mask when the point of gravity of the substrate grating mark is aligned with respect to the point of gravity of the mask alignment mark. In that case it has been assumed that the point of gravity for each grating mark coincides with the geometrical center of the grating. However, the CMP process renders the substrate grating mark asymmetrical so that this alignment method is no longer reliable. In addition, the various processing steps contribute to changes in the alignment marks including introducing asymmetries and changes in the effective depth of the grooves of the substrate grating marks. Since the signal strength of monochromatic light reflected from such a phase grating varies periodically with the depth of the grooves, the processing can render grating marks undetectable in some cases or provide only a weak signal in other cases. This leads to a decrease in the robustness of the alignment system in that there are cases when an expected alignment detection cannot be made due to a loss of signal strength. This can also lead to a decrease in alignment precision if a weak signal is used to determine the position of the alignment mark. One approach to alleviate this problem is to use two separate wavelengths to illuminate and detect the position of the alignment mark on the substrate. However, the use of light sources in such systems that are in the visible region of the spectrum, e.g., a red and a green laser, results in situations where the signals at both wavelengths are weak, thus leading to problems with robustness and precision of detection of the alignment marks on the substrate.

SUMMARY

It is thus an object of the present invention to provide an alignment system for a lithographic apparatus that has improved alignment accuracy and/or robustness.

In order to achieve this and other objectives of this invention an alignment system for a lithographic apparatus is provided with a source of alignment radiation at a first wavelength and a second wavelength; a detection system that has a first wavelength channel arranged to receive alignment radiation from an alignment mark at the first wavelength and a second wavelength channel arranged to receive alignment radiation from the alignment mark at the second wavelength; and a position determining unit in communication with the detection system. The position determining unit processes information from the first wavelength channel or the second wavelength channel or the first and second wavelength channels in combination to determine a position of the alignment mark on a first object relative to a reference position on a second object based on the combined information.

According to another aspect of this invention, a lithographic apparatus has a source of illumination radiation; a substrate stage assembly arranged in a radiation path of illumination radiation from said illumination source; a reticle stage assembly arranged in said radiation path of said illumination radiation between said illumination source and said substrate stage assembly; a projection system arranged between said reticle stage assembly and said substrate stage assembly; and an alignment system arranged proximate at least one of said substrate stage assembly and said reticle stage assembly. The alignment system contains a source of alignment radiation at a first wavelength and a second wavelength; a detection system that has a first wavelength channel arranged to receive alignment radiation from an alignment mark at the first wavelength and a second wavelength channel arranged to receive alignment radiation from the alignment mark at the second wavelength channel; and a position determining unit in communication with the detection system. The position determining unit processes information from the first and second wavelength channels in combination to determine a position of the alignment mark on a first object relative to a reference position on a second object based on the combined information. The alignment system may be located away from said radiation path of illumination radiation. All that is required is that alignment radiation from the alignment system is able to reach the substrate stage assembly. Another aspect of this invention provides a method of detecting an alignment mark on a substrate that includes illuminating the alignment mark with a beam of illumination radiation that has at least two different illumination wavelengths; detecting illumination radiation from the alignment mark at a first wavelength of the at least two different illumination wavelengths and outputting a first wavelength signal; detecting illumination radiation from the alignment mark at a second wavelength of the at least two different illumination wavelengths and outputting a second wavelength signal; and determining a position of the alignment mark based on the first and second wavelength signals.

DETAILED DESCRIPTION

Methods and devices according to this invention will now be described with reference to particular embodiments by way of example. The broad concepts of this invention are not limited to only these specifically described embodiments. The invention will be described with reference to an alignment system for a lihography system that includes both an on-axis (also referred to as "axial") and an off-axis ("off-axial") alignment system that can be used in combination to obtain the ultimate alignment of a mask with respect to a substrate ("workpiece"). The axial alignment system may have a separate source of radiation to illuminate alignment marks, such as in through-the-lens (TTL) or through-the-reticle (TIR) systems, or it may employ the same radiation as the exposure radiation. The following example will describe a TTL system in combination with an off-axial system (OAS) as an embodiment of this invention. Furthermore, the invention envisions application to lihography systems that have refraction projection systems as well as to other types of lithography systems that use shorter wavelengths of electromagnetic radiation than currently employed, systems which use reflective and/or diffraction imaging optics, and/or systems which use other types of radiation such as charged-particle beams, e.g., electron beams or ion beams that are imaged with magnetic, electromagnetic, and/or electrostatic imaging optics.

We now describe an lithographic apparatus that has an on-axis alignment unit and other measuring systems as an example of a system that may incorporate an embodiment of the instant invention.

Figure 1:
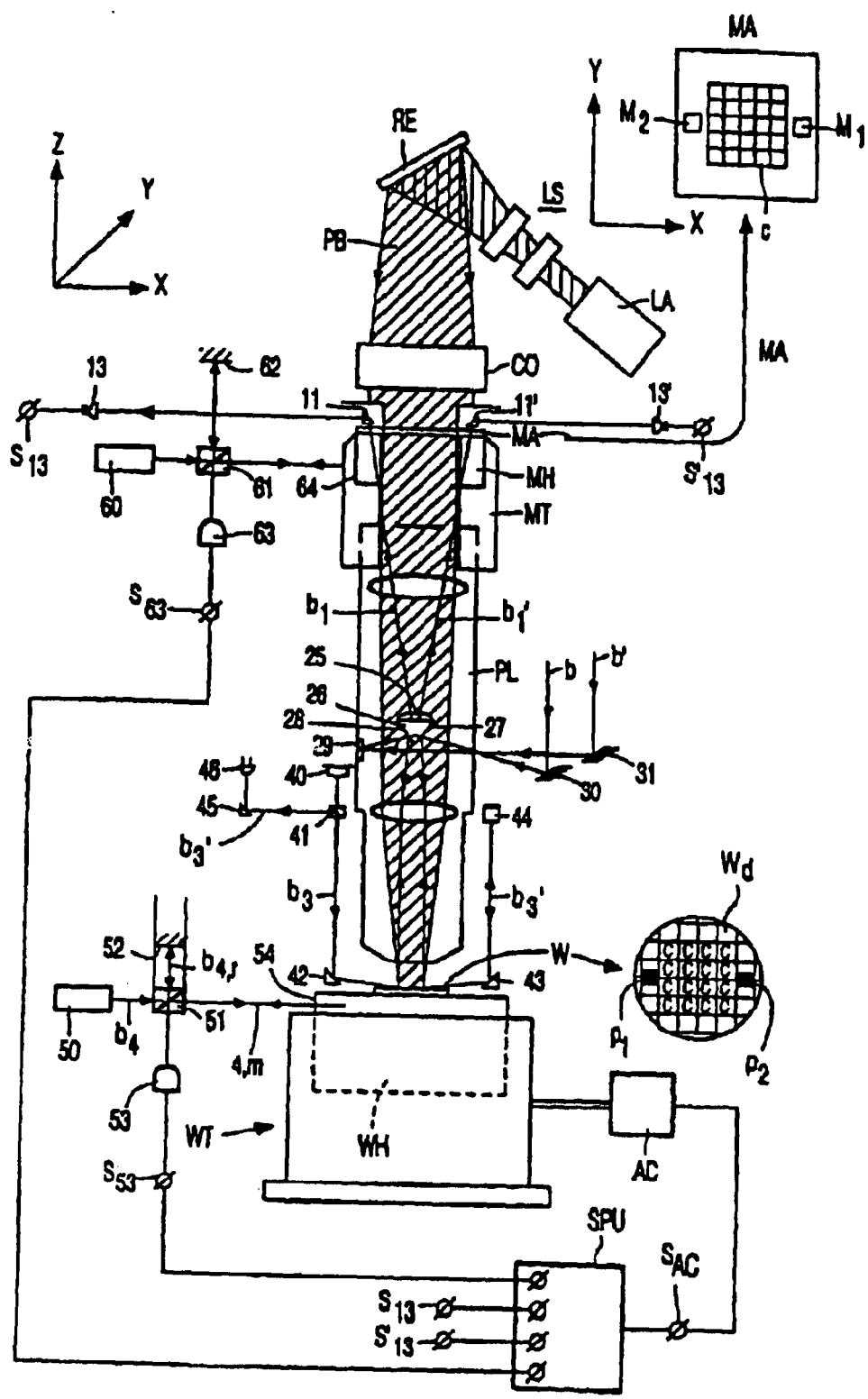
FIG. 1 lihographic apparatus depicts a lithographic apparatus according to an embodiment of the invention.

FIG. 1 shows diagrammatically the optical elements of an embodiment of such an apparatus for step-and-scan imaging a mask pattern on a substrate. This apparatus comprises, as its main component, a projection column incorporating a projection system PL. Situated on one side of the projection system is a mask holder MH for a mask MA in which the mask pattern C to be imaged is provided. The mask holder is part of a mask stage MT. A substrate stage WT is arranged on the other side of the projection lens system PL. This stage comprises a substrate holder WH for a substrate W provided with a photosensitive layer. The mask pattern C must be imaged a number of times in the photosensitive layer, every time in a different area, a substrate area $W_d$. The substrate table is movable in the X and Y directions so that, after imaging the mask pattern in a first substrate area, a subsequent substrate area can be positioned under the mask pattern.

The apparatus further comprises an illumination system which is provided with a radiation source LA, for example a Krypton-Fluoride Excimer laser or a mercury lamp, a lens system LS, a mirror RE and a condenser lens CO. The projection beam PB supplied by the illumination system illuminates the mask pattern C. This pattern is imaged by the projection lens system PL on an substrate area of the substrate W. The projection lens system has, for example, a magnification M=¼, a numerical aperture NA=0.6 and a diffraction-limited image field with a diameter of 22 mm.

The apparatus is further provided with a number of measuring systems, namely a system for aligning the mask MA and the substrate W with respect to each other in the XY plane, an interferometer system for determining the position and orientation of the substrate holder and hence of the substrate, and a focus error detection system for determining a difference between the focal or image plane of the projection lens system PL and the surface of the substrate W. These measuring systems are parts of servosystems which comprise electronic signal-processing and control circuits and drivers, or actuators, with which the position and orientation of the substrate and the focusing can be corrected with reference to the signals supplied by the measuring systems.

Figure 2:
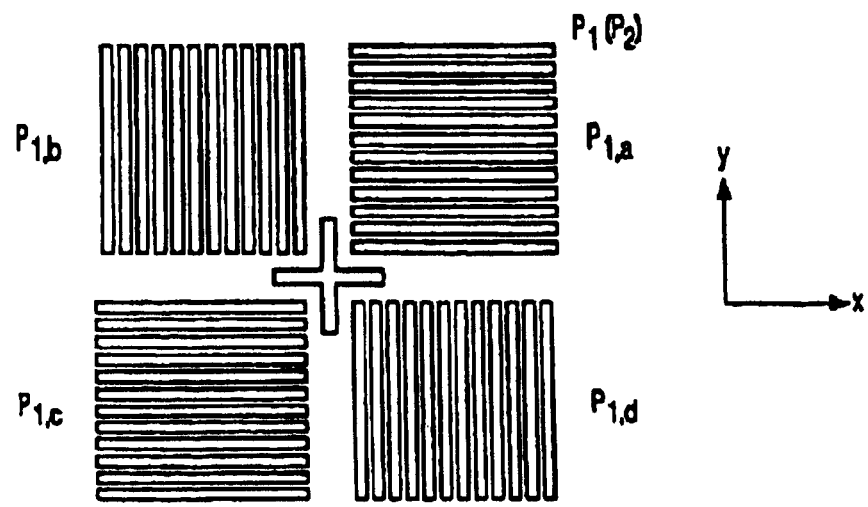
FIG. 2 shows an embodiment of a substrate alignment mark.

The alignment system makes use of two alignment marks $M_1$ and $M_2$ in the mask MA shown in the top right part of FIG. 1. As is shown in FIG. 2, these marks may be diffraction gratings, but may alternatively be other marks such as squares or strips which are generally optically distinguished from their surroundings. The alignment marks may be two-dimensional, i.e. they extend in two mutually perpendicular directions, for instance the X and Y directions in FIG. 1, or may be used in conjunction with other marks to extend in two mutually perpendicular directions, for instance the X and Y directions. The substrate W, for example a semiconductor substrate, has at least two alignment marks, which may be two-dimensional diffraction gratings, two of which, $P_1$ and $P_2$, are shown in FIG. 1. The marks $P_1$ and $P_2$ are situated outside the device areas on the substrate W. The grating marks $P_1$ and $P_2$ are preferably implemented as phase gratings and the grating marks $M_1$ and $M_2$ are preferably implemented as amplitude gratings. Other types of alignment marks may be provided along scribe lines between adjacent circuits.

FIG. 1 shows a special embodiment of an on-axis alignment unit, namely a double alignment unit in which two alignment beams b and b' are used for aligning the substrate alignment mark $P_2$ on the mask alignment mark $M_2$, and for aligning the substrate alignment mark $P_1$ on the mask alignment mark $M_1$, respectively. The beam b is reflected by a reflecting element 30, for example a mirror, towards a reflecting surface 27 of a prism 26. The surface 27 reflects the beam b towards the substrate alignment mark $P_2$ which sends a part of the radiation as beam $b_1$ to the associated mask mark M where an image of the mark $P_2$ is formed. A reflecting element 11, for example a prism, directs the radiation that passes by the mark $M_2$ towards a radiation-sensitive detector 13.

The second alignment beam b' is reflected by a mirror 31 towards a reflector 29 in the projection lens system PL. This reflector sends the beam b' to a second reflecting surface 28 of the prism 26, which surface directs the beam b' onto the substrate alignment mark $P_1$. This mark reflects a part of the radiation of the beams b' as beam $b'_1$ to the mask alignment mark $M_1$ where an image of the mark $P_1$ is formed. The radiation of the beam $b'_1$ passing through the mark $M_1$ is directed by a reflector 11' towards a radiation sensitive detector 13'.

FIG. 2 shows an embodiment of one of the two identical substrate marks, in the form of phase gratings, on a larger scale. Such a grating may consist of four subgratings $P_{1,a}$, $P_{1,b}$, $P_{1,c}$ and $P_{1,d}$, two of which, $P_{1,b}$ and $P_{1,d}$, serve for alignment in the X direction and the two other ones, $P_{1,a}$ and $P_{1,c}$ serve for alignment in the Y direction. The two sub-gratings $P_{1,b}$ and $P_{1,c}$ have a grating period of, for example 16 $\mu$m and the subgratings $P_{1,a}$ and $P_{1,d}$ have a grating period of, for example 17.6 $\mu$m. Each sub-grating may have a dimension of, for example 200×200 $\mu$m. An alignment accuracy which, in principle, is smaller than 0.1 $\mu$m can be achieved with this grating mark and a suitable optical system. By choosing different grating periods, the capture range of the alignment unit can be enlarged. This range is, for example 44 $\mu$m.

Figure 3:
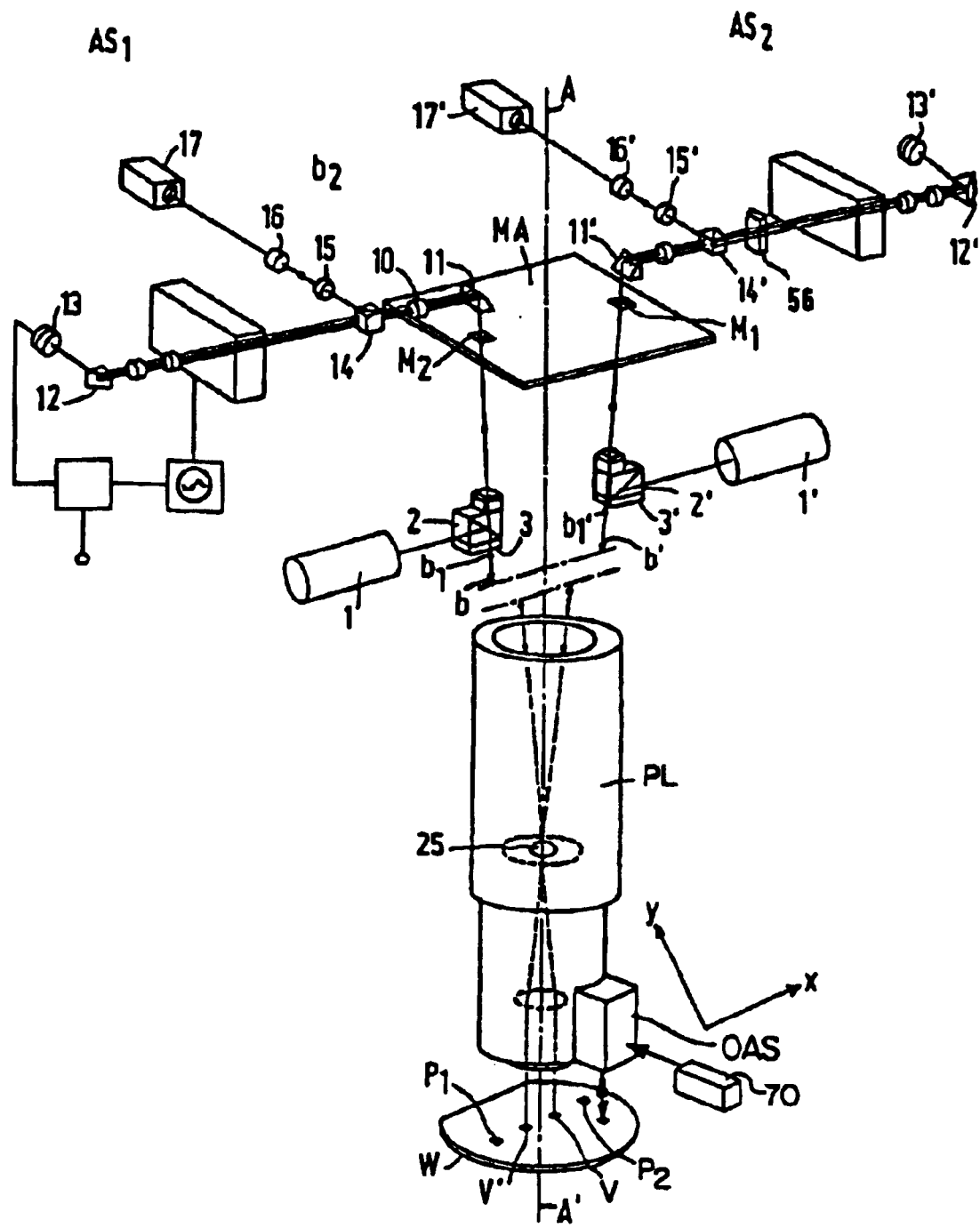
FIG. 3 shows an embodiment of a double alignment unit for aligning a mask mark and a substrate mark with respect to each other.

FIG. 3 shows the optical elements of a, slightly modified, alignment unit in greater detail. The double alignment unit comprises two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the system $AS_2$ being primed so as to distinguish them from those of the system $AS_1$.

The structure of the system $AS_1$ will now be described, as well as the way in which the mutual position of the mask mark $M_2$ and, for example, the substrate mark $P_2$ is determined with this system.

The alignment system $AS_1$ comprises a radiation source 1, for example a Helium-Neon laser emitting an alignment beam b. This beam is reflected to the substrate W by a beam splitter 2. The beam splitter may consist of a semitransparent mirror or a semitransparent prism but is preferably constituted by a polarization-sensitive splitting prism 2 preceding a $\lambda/4$ plate 3, in which $\lambda$ is the wavelength of the beam b. The projection lens system PL focuses the beam b in a small radiation spot V, having a diameter of the order of 1 mm, on the substrate W. This substrate reflects a part of the beam as beam $b_1$ towards the mask MA. The beam $b_1$ traverses the projection lens system PL, which system images the radiation spot V on the mask. Before the substrate is arranged in the lihographic apparatus, it has been pre-aligned in a pre-alignment station coupled to the apparatus, for example the station described in EP Patent Application 0 164 165, such that the radiation spot V is located on the substrate mark $P_2$. This mark is then imaged on the mask mark $M_2$ by the beam $b_1$. With the magnification M of the projection lens system being taken into account, the dimension of the mask mark $M_2$ is adapted to that of the substrate mark $P_2$ so that the image of the mark $P_2$ coincides accurately with the mark $M_2$ when the two marks are mutually positioned correctly.

On its path to and from the substrate W, the beams b and $b_1$ have traversed the $\lambda/4$ plate 3 twice, whose optical axis is at an angle of 45° to the direction of polarization of the linearly polarized beam b coming from the source 1. The beam $b_1$ passing through the $\lambda/4$ plate then has a direction of polarization which is rotated 90° with respect to the beam b so that the beam $b_1$ is passed by the polarization splitting prism. The use of the polarization splitting prism in combination with the $\lambda/4$ plate provides the advantage of a minimal radiation loss when coupling the alignment beam into the radiation path of the alignment system.

The beam $b_1$ passed by the alignment mark $M_2$ is reflected by a prism 11 and directed, for example by a further reflecting prism 12 towards a radiation-sensitive detector 13. This detector is, for example a composite photodiode having, for example four separate radiation-sensitive areas in conformity with the number of sub-gratings shown in FIG. 2. The output signals of the detector areas are a measure of coincidence of the mark $M_2$ with the image of the substrate mark $P_2$. These signals can be processed electronically and used for moving the mask and the substrate with respect to each other by means of driving systems (not shown), such that the image of the mark P coincides with the mark M. An automatic alignment system is thus obtained.

A beam splitter 14 in the form of, for example a partially transparent prism splitting a portion of the beam $b_1$ as beam $b_2$ may be arranged between the prism 11 and the detector 13. The split beam is incident via, for example two lenses 15 and 16 on a television camera 17 which is coupled to a monitor (not shown) on which the alignment marks $P_2$ and $M_2$ are visible to an operator of the lihographic apparatus. This operator can then ascertain whether the two marks coincide and move the substrate W by means of manipulators so as to cause the marks to coincide.

Analogously as described hereinbefore for the marks $M_2$ and $P_2$, the marks $M_1$ and $P_2$ and the marks $M_1$ and $P_1$ can be aligned with respect to each other. The alignment system $AS_2$ is used for the last-mentioned two alignments.

For further particulars about the construction and the alignment procedure of the double alignment unit, reference is made to U.S. Pat. No. 4,778,275, which is incorporated herein by reference.

The embodiment of the on-axis alignment unit shown in FIG. 1 is particularly suitable for an apparatus in which a projection beam PB having a short wavelength, for example 248 nm, and an alignment beam having a considerably larger wavelength, for example 633 nm, are used.

Since the projection lens system is designed for the wavelength of the projection beam PB, differences occur when this system PL is used for imaging the alignment marks $P_1$, $P_2$ and $M_1$ and $M_2$ on each other by means of the alignment beam. For example, the substrate alignment marks will not be situated in the plane of the mask pattern in which the mask alignment marks are situated, but will be imaged at a given distance therefrom, which distance depends on the difference between the wavelength of the projection beam and the alignment beam and the difference between the refractive indices of the material of the projection lens elements for the two wavelengths. If the projection beam has a wavelength of, for example 248 nm and the alignment beam has a wavelength of 633 nm, this distance may be 2 mm. Moreover, due to said wavelength difference, a substrate alignment mark is imaged on a mask alignment mark with a magnification which differs from the desired magnification and increases with an increasing wavelength difference.

To correct for said differences, the projection lens system PL incorporates an extra lens, a correction lens, 25. The correction lens is arranged at such a height in the projection lens that, on the one hand, in the plane of the correction lens the sub-beams of the different diffraction orders of the alignment beam, which sub-beams originate from, and are also generated by the diffraction at, a substrate alignment mark, are sufficiently separated to be able to influence these sub-beams separately and, on the other hand, this correction lens has a negligible influence on the projection beam and the mask pattern image formed with it. The correction lens is preferably situated in the Fourier plane of the projection lens system. If, as is shown in FIG. 3, the correction lens 25 is situated in a plane in which the chief rays of the alignment beams b and b' intersect each other, then this lens can be used for correcting both alignment beams.

If desired, a wedge or a different deflection element such as a diffraction element may be arranged in the path of the alignment beam(s) proximate to an alignment mark. With such a deflection element, not shown in FIG. 3, alignment errors resulting from unintentional phase differences within the selected alignment beam portions received by the detector 13 or 13' may be prevented, which phase differences may occur if the axis of symmetry of the alignment beam portions coming from a substrate alignment mark is not perpendicular to the mask plate, so that false reflections may occur within this plate. An alignment unit provided with such a deflection element is described in EP Patent Application 0 467 445.

In addition to the global alignment marks $P_1$ and $P_2$, shown in FIG. 1, which are used for aligning the entire substrate with respect to the mask, referred to as global alignment, the substrate may be provided with further alignment marks per device area so as to align each device area separately with respect to the mask pattern. The mask may also comprise more than two alignment marks in which the further alignment marks may be used, for example to measure the rotation of the mask about the Z axis so that this rotation can be corrected.

The lihographic apparatus further comprises a focus error detection system for determining a deviation between the focal plane of the projection lens system PL and the surface of the substrate W, so that this deviation can be corrected, for example by moving the projection lens system along its axis, the Z axis. This system may be constituted by the elements 40, 41, 42, 43, 44, 45 and 46 which are arranged in a holder (not shown) which is fixedly connected to the projection lens system. The reference numeral 40 denotes a radiation source, for example a diode laser, which emits a focusing beam $b_3$. This beam is directed at a small angle onto the substrate by a reflecting prism 42. The beam reflected by the substrate is directed towards a retroreflector 44 by the prism 43. The element 44 reflects the beam in itself so that the beam ($b_3'$) once again traverses the same path via reflections on the prism 43, the substrate W and the prism 42.

The beam $b_3'$ reaches a radiation-sensitive detection system 46 via a partially reflecting element 41 and a reflecting element 45. This detection system consists of, for example a position-dependent detector, or of two separate detectors. The position of the radiation spot formed by the beam $b_3'$ on this system is dependent on the extent to which the focal plane of the projection lens system coincides with the plane of the substrate W. For an extensive description of the focus error detection system, reference is made to U.S. Pat. No. 4,356,392.

For accurately determining the X and Y positions of the substrate holder, a stepping lithographic apparatus is provided with a multi-axis interferometer system. U.S. Pat. No. 4,251,160 describes a system with two measuring axes and U.S. Pat. No. 4,737,283 describes a system with three measuring axes. In FIG. 1, such an interferometer system is diagrammatically shown by means of the elements 50, 51, 52 and 53, while only one measuring axis, the X axis, is shown. A beam $b_4$ emitted by a radiation source 50 in the form of a laser is split by a beam splitter 51 into a measuring beam $b_{4,m}$ and a reference beam $b_{4,r}$. The measuring beam reaches a reflecting side face 54 of the substrate holder WH and the reflected measuring beam is combined by the beam splitter 51 with the reference beam reflected by a stationary retroreflector, for example a corner cube. The intensity of the combined beam is measured with a detector 53, and the displacement, in this case in the X direction, of the substrate holder WH can be derived from the output signal of this detector, and also an instantaneous position of this holder can be determined.

As is diagrammatically shown in FIG. 1, the interferometer signals, represented for the sake of simplicity by one signal $S_{53}$, and the signals $S_{13}$ and $S'_{13}$ of the double alignment unit are applied to a signal-processing unit SPU, for example a microcomputer, which processes said signals to control signals $S_{AC}$ for an actuator AC with which the substrate holder is moved in the XY plane via the substrate table WT.

With an interferometer system, which has not only the X measuring axis shown in FIG. 1 but also a Y measuring axis and possibly a third measuring axis, the positions of, and the mutual distances between, the alignment marks $P_1$, $P_2$ and $M_1$, $M_2$ can be fixed in a system of coordinates defined by the stationary interferometer system during the initial, or global, alignment of the mask and the substrate with respect to each other. This interferometer system is also used for moving the substrate table very accurately, which is necessary for a stepping lihographic apparatus so as to be able to step very accurately from a first IC area to a second IC area.

If, as shown in FIG. 1, the lithographic apparatus is a step-and-scan apparatus, in which the mask and the substrate must be moved synchronously during the projection of the mask pattern in an device area, the mask must also be moved in one direction, the scanning direction. With the magnification M of the projection lens system being taken into account, this movement must be synchronous with the corresponding movement of the substrate. Then, the mask and the substrate must stand still with respect to each other during projection and both must be moved with respect to the projection lens system and the projection beam. To measure the movement of the mask, the apparatus must be provided with a second interferometer system. This interferometer system comprises the elements 60, 61, 62, 63 and 64 which have a similar function as the elements 50, 51, 52, 53 and 54. The signals from the mask interferometer system, represented for the sake of simplicity by a signal $S_{63}$ in FIG. 1, are applied to the signal-processing unit SPU in which these signals are compared with the corresponding signals from the substrate interferometer system. It can then be ascertained whether the mask and the substrate mutually have the correct position and/or move synchronously.

If the positions in the X and Y directions of the mask are represented by $X_r$, $Y_r$ and those of the substrate by $X_w$, $Y_w$ and the rotation about the Z axis by $\phi_{r,r}$ and $\phi_{z,w}$, then the following conditions are satisfied when the mask and the substrate are correctly positioned with respect to each other:

$$X_w - M.X_r = 0 \tag{1}$$

$$Y_w - M.Y_r = 0 \tag{2}$$

$$\Phi_{z,w} - \phi_{z,r} = 0 \tag{3}$$

in which M is the magnification of the projection lens system. It has been assumed that the mask and the substrate move in opposite directions. If these elements move in the same direction, the minus sign preceding M in the above conditions should be replaced by a plus sign.

To ascertain whether these conditions have been met, it is sufficient that both the interferometer system for the substrate and that for the mask have three measuring axes.

However, the substrate interferometer system preferably measures not only $X_w$, $Y_w$ and $\phi_{z,w}$ but also $\phi_{x,w}$ and $\phi_{y,w}$ i.e. it is able to measure the tilts about the X axis and the Y axis.

Analogue to the substrate interferometer system the mask interferometer system may also not only measure $X_r$, $Y_r$ and $\phi_{z,r}$ but also measure $\phi_{x,r}$ and $\phi_y$. To be able to measure such tilts of the mask, a five-axis mask interferometer system may be used, or a combination of a three-axis interferometer system for determining $X_r$, $Y_r$ and $\phi_{z,r}$ and other sensors such as capacitive sensors for the $\phi_{x,r}$ and $\phi_{y,r}$ measurements.

If $X_w$, $Y_w$, $\phi_{x,w}$, $\phi_{y,w}$ and $\phi_{z,w}$ and $X_r$, $Y_r$, $\phi_{z,r}$, $\phi_{x,r}$, $\phi_{y,r}$ and, with the aid of the focus error detection system, $Z_w$ and $Z_r$, i.e. the positions along the Z axis of the substrate and the mask can be measured, it can be ascertained whether not only the conditions (1), (2) and (3) are met, but also the conditions:

$$M^2.Z_w - Z_r = 0 \tag{4}$$

$$M.\phi_{x,w} - \phi_{x,r} = 0 \tag{5}$$

$$M.\phi_{y,w} - \phi_{y,r} = 0 \tag{6}$$

The on-axis alignment unit, described with reference to FIG. 3, for mutually aligning a mask alignment mark and a substrate alignment mark with respect to each other has been found to be eminently suitable for both stepping and step-and-scan lihographic apparatuses with which images having line widths up to a given minimal value are formed. However, it is expected that the use of novel technologies in the IC manufacture and decreasing line widths in the images will lead to problems as far as accuracy and reliability of the known alignment unit are concerned. When reducing the line width, the alignment accuracy must be enhanced. When using said CMP process, asymmetries are introduced in the substrate grating mark so that the alignment procedure in which the first-order sub-beams are used becomes unreliable. Moreover, when using an alignment beam having one wavelength, strict requirements must be imposed on the depth of the grating grooves of the alignment mark, which requirements can only be met with increasing difficulty.

All of these problems can be solved by making use of an off-axis alignment unit for aligning the substrate mark and by using higher-order sub-beams, i.e. sub-beams having a diffraction order which is higher than 1, in the alignment. Here it will be understood that references to the sub-beams with a diffraction order higher than 1 may in some instances include the sub-beams with respective negative diffraction order (for example $-3^{nd}$ order and $-5^{th}$ order). Since the alignment of the substrate mark no longer takes place through the projection lens system, there will be greater freedom to use more sub-beams, particularly higher-order sub-beams. Since the resolving power of the alignment unit increases with an increasing order number of the sub-beams, the accuracy of the alignment can be enhanced considerably. Since notably the higher-order sub-beams are determined by the edges of the substrate grating mark and, as compared with the center of the grating, these edges are less influenced by said CMP process and other measures affecting the symmetry of the grating, the problem of asymmetry in the grating mark is largely eliminated. Moreover, it is also possible to use alignment radiation with more than one wavelength so that the requirements imposed on the depth of the grating grooves can be alleviated considerably.

As will be elucidated hereinafter, the diffraction orders are separated from each other by optical elements in the alignment unit according to the invention. Consequently, it is not necessary to measure signal amplitudes but the phase measurements which are more conventional in these kinds of techniques can be used.

Figure 4:
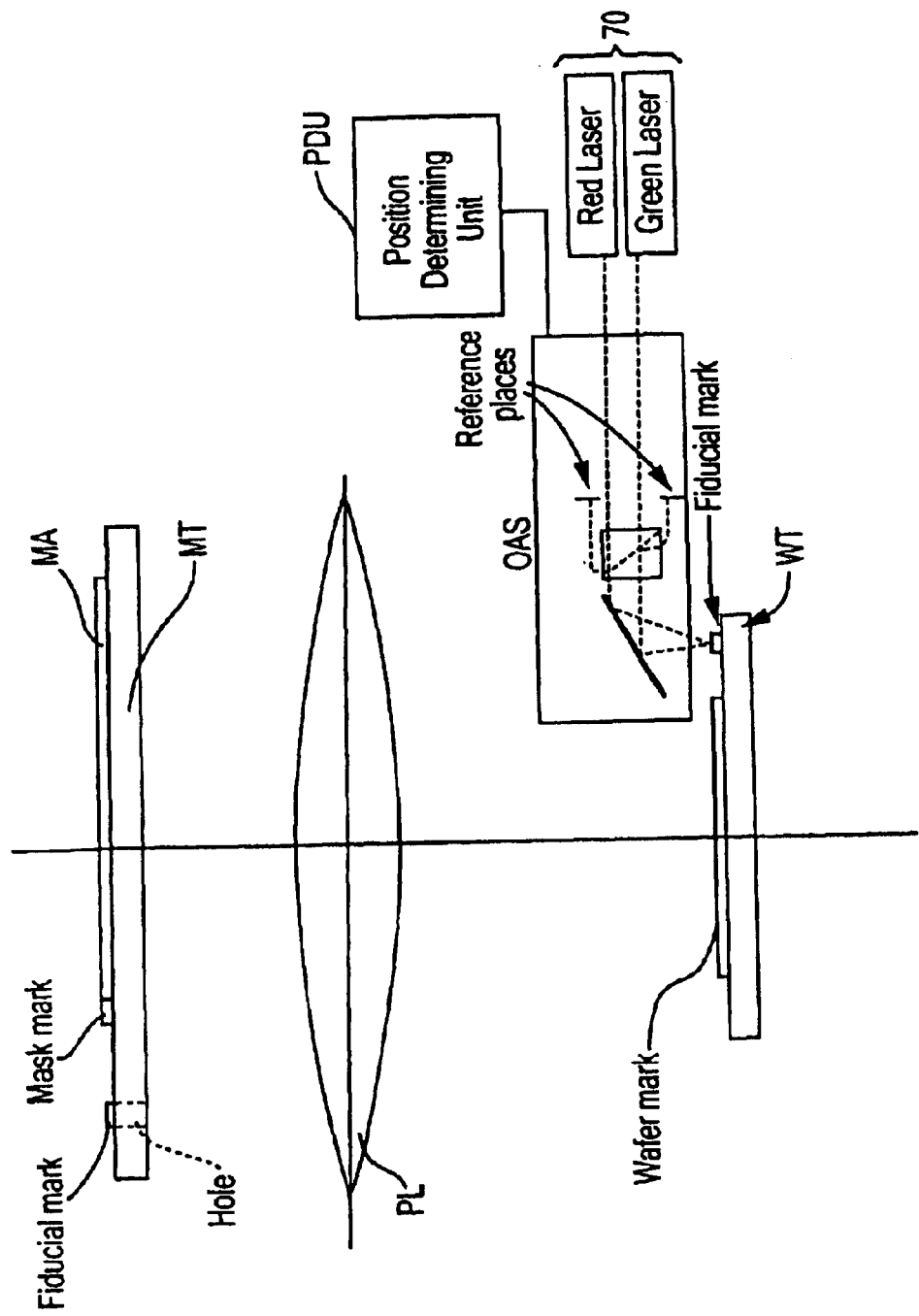
FIG. 4 is a schematic illustration of a lithographic apparatus that has an off-axial alignment system according to an embodiment of this invention.

FIG. 4 is a schematic illustration of a lithographic system that has an off-axis alignment system. The off-axis alignment system has two sources of radiation 70 for illuminating alignment marks at two different wavelengths, for example a red laser and a green laser. Both lasers illuminate an alignment mark substantially simultaneously and reflected light is directed to separate detector channels (e.g., a red channel and a green channel). Of course if one were to toggle between wavelengths, especially at high frequencies, one would achieve substantially the same effect. Such a modification is considered within the scope of this invention. Signals in each of the two wavelength channels are thus obtained substantially in parallel. A position determining unit PDU is in communication with the detectors that include at least one wavelength channel for the at least two different wavelengths, e.g., at least one red channel and at least one green channel. The position determining unit PDU may be a hard-wired special purpose device performing particular functions or it may include a programmable computer that is programmed to perform the desired functions. In addition, it may be a separate unit from the SPU illustrated in FIG. 1 or it may be implemented through software in the SPU. The position determining unit PDU processes signals from one or the other of the two wavelength channels, or both signals together, to determine the position of the alignment mark being detected.

Figure 5:
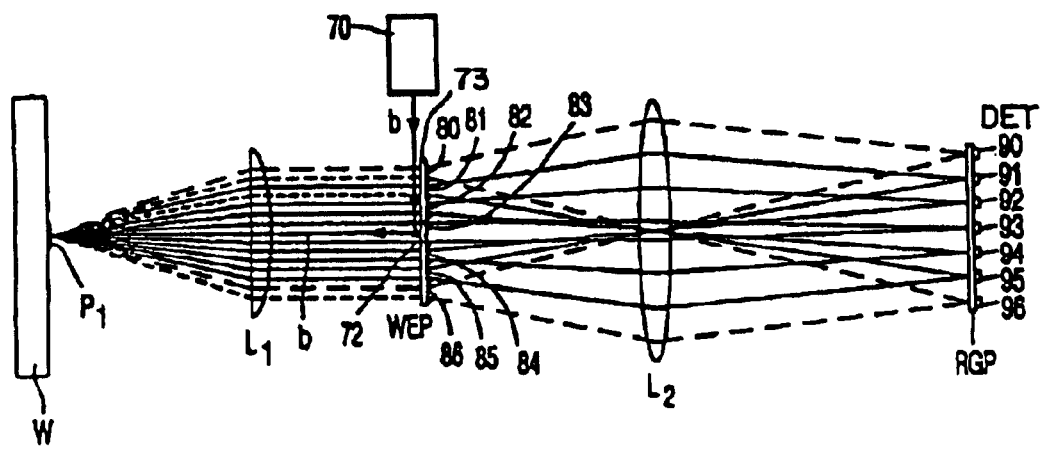
FIG. 5 shows an embodiment of an off-axis alignment unit according to the invention.

FIG. 5 is a schematic illustration of an off-axis alignment unit according to an embodiment of this invention. Many structural features of alignment systems described here are similar or the same as those described in U.S. Pat. No. 6,297,876, the entire content of which is incorporated herein by reference. The substrate mark, in the form of a grating, is denoted by $P_1$. A parallel alignment beam b having a wavelength $\lambda$ incident on this grating is split up into a number of sub-beams extending at different angles $\alpha_n$ (not shown) to the normal on the grating, which angles are defined by the known grating formula:

$$\sin\alpha_n = \frac{N \cdot \lambda}{P} \quad (7)$$

wherein N is the diffraction order number and P the grating period.

The path of the sub-beams reflected by the grating incorporates a lens system $L_1$ which converts the different directions of the sub-beams at angles $\alpha_n$ into different positions $u_n$ of these sub-beams in a plane 73:

$$u_n = f_1 \cdot \alpha_n \quad (8)$$

where $f_1$ is the focal length of lens system $L_1$.

In this plane, means are provided for further separating the different sub-beams. To this end, a plate may be arranged in this plane, which is provided with deflection elements in the form of, for example wedges. In FIG. 5, the wedge plate is denoted by WEP. The wedges are provided on, for example the rear side of the plate. A prism 72 can then be provided on the front side of the plate, with which an alignment beam coming from the radiation source 70, for example a He—Ne laser can be coupled into the alignment unit. This prism can also prevent the 0-order sub-beam from reaching the detectors. The number of wedges corresponds to the number of sub-beams which is to be used. In the embodiment shown, there are six wedges per dimension for the plus orders so that the sub-beams can be used up to and including the 7-order for the alignment. All wedges have a different wedge angle so that an optimal separation of the different sub-beams is obtained.

A second lens system $L_2$ is arranged behind the wedge plate. This lens system images the mark $P_1$ in the plane of reference plate RGP. In the absence of the wedge plate, all sub-beams would be superimposed in the reference plane. Since the different sub-beams through the wedge plate are deflected at different angles, the images formed by the sub-beams reach different positions in the reference plane. These positions $X_n$ are given by $$X_n = f_2 \cdot \gamma_n \quad (9)$$

in which $\gamma_n$ is the angle at which a sub-beam is deflected by the wedge plate.

Figure 6:
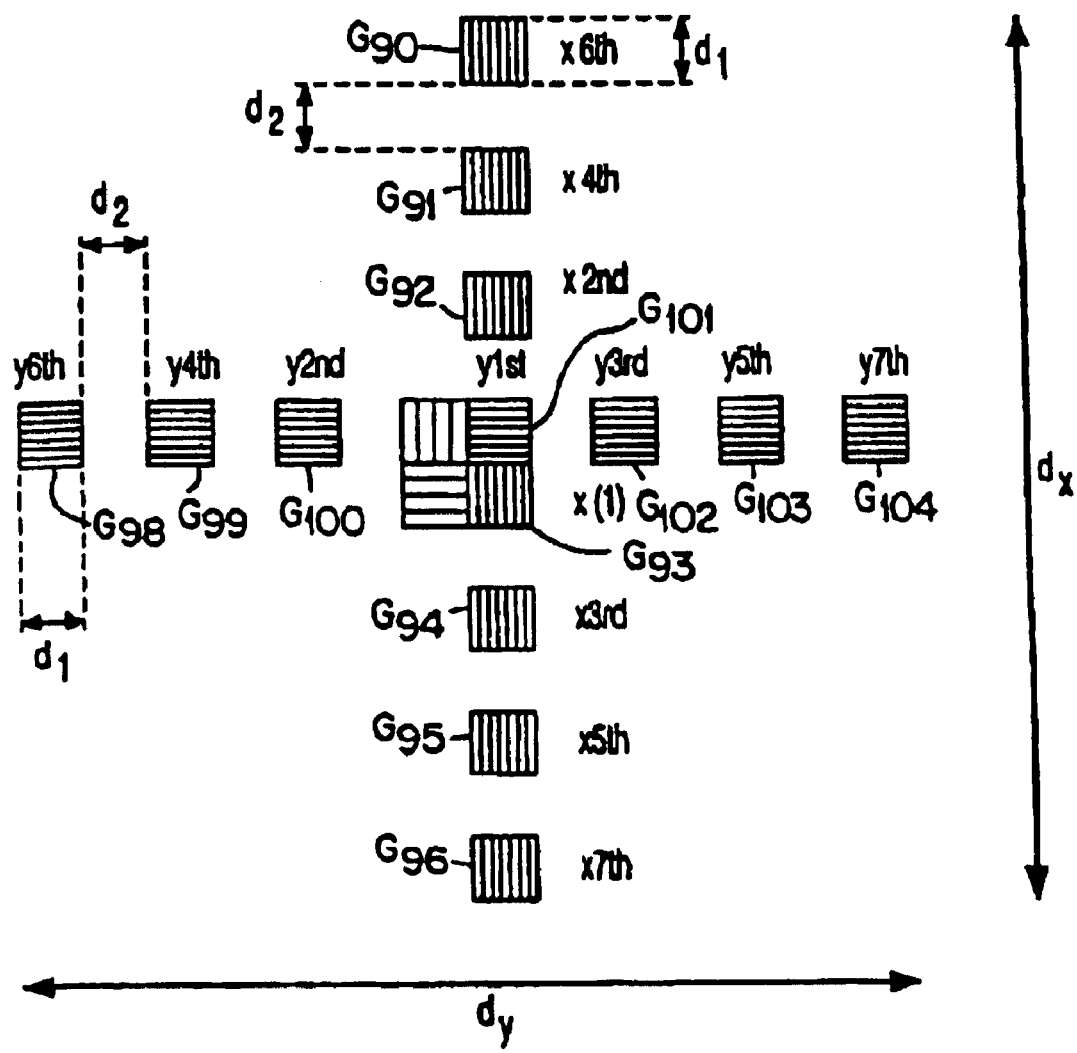
FIG. 6 shows a plate with reference gratings used in an embodiment of the invention.

At these positions, reference gratings $G_{90}$–$G_{96}$ can be provided, as is shown in FIG. 6. A separate detector 90–96 is arranged behind each of these reference gratings. The output signal of each detector is dependent on the extent to which the image of the substrate grating $P_1$ coincides with the relevant reference grating. Hence, the extent of alignment of the substrate grating, and thus of the substrate, can be measured with each detector 90–96. However, the accuracy with which the measurement takes place is dependent on the order number of the sub-beam used; as this order number is larger, the accuracy is greater. In FIG. 6, it has been assumed for the sake of simplicity that all reference gratings $G_{90}$–$G_{96}$ have the same grating period. Actually, however, the grating period of each grating is adapted to the order number of the associated sub-beam. As the order number is larger, the grating period is smaller and a smaller alignment error can be detected.

Hitherto only one set of diffraction orders has been considered. As is known, a diffraction grating forms, in addition to +1, +2, +3 etc order sub-beams, also sub-beams of diffraction orders −1, −2, −3 etc. Both the plus orders and the minus orders sub-beams can be used to form the grating image, i.e. a first image of the grating mark is formed by the +1 and −1 order sub-beams jointly, a second image is formed by the +2 and −2 order sub-beams jointly, and so forth. For the +1 order and the −1 order sub-beams no wedges need to be used, but plane-parallel plates which compensate for path-length differences can be provided at the positions of these sub-beams in the plane of the wedge plate. Thus six wedges, both for the plus orders and for the minus orders, are required for the orders 2–7.

Figure 7:
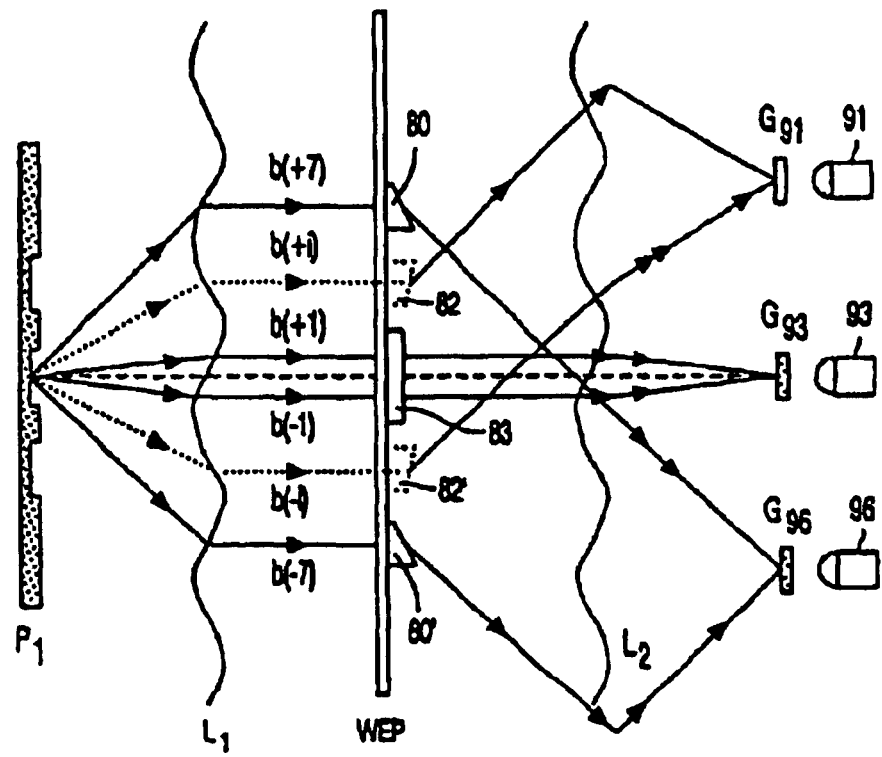
FIG. 7 shows the deflection by the wedge elements in an embodiment of the invention.

FIG. 7 illustrates more clearly the functioning of the wedges of the embodiment of FIG. 5. In the more schematic FIG. 6, the first lens system $L_1$ and the second lens system $L_2$ are represented by wavy lines. For clearness sake only the sub-beams of the first orders b(+1) and b(−1), the sub-beams of the seventh order b(+7) and b(−7) and the sub-beams of another order b(+i) and b(−i), for example the fifth order, are shown. As FIG. 7 illustrates, the wedge angles, i.e. the angle which the inclined face of the wedge makes with the plane surface of the wedge plate WEP, of the wedges 80 and 80' are such that the sub-beams b(+7) and b(−7) are deflected in parallel directions and converged by the second lens system on one reference grating $G_{96}$. Also the sub-beams b(+i) and b(−i) are deflected by the associated wedges 82 and 82' in parallel directions and converged on one reference grating $G_{91}$. The first order sub-beams are not deflected and are converged by the second lens system on one reference grating $G_{93}$. By using both the plus order and the minus order of each diffraction order a truthful image of the substrate grating mark $P_1$ is formed on the associated reference grating and a maximum use is made of the available radiation.

Figure 8:
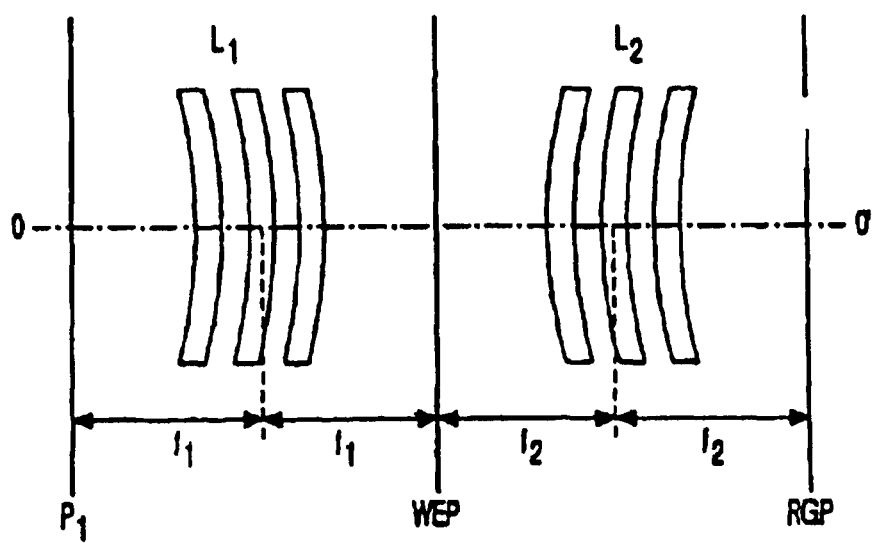
FIG. 8 shows an arrangement of the first and second lens systems in the alignment unit according to an embodiment of the invention.

FIG. 8 shows the preferred positions, with respect to the plane of the mark $P_1$ and the reference grating plate RGP, of the lens systems $L_1$ and $L_2$ and the focal lengths of these lens systems. The lens system has a focal length $f_1$ and this system is arranged at a distance $f_1$ from the plane of the mark $P_1$. The lens system $L_1$ deflects the chief rays of the sub-beams in directions parallel to the optical axis OO'. The distance between the first lens system and the second lens system is equal to $f_1+f_2$ whereby $f_2$ is the focal length of the second lens system. The reference grating plate is arranged at a distance $f_2$ from the second lens system. As in the path between the two lens systems the chief rays of the sub-beams are parallel to the optical axis OO', the position of the wedge plate is not critical.

In order that in the embodiment of FIG. 5 the plus and minus order sub-beams of the same diffraction order are deflected such that they can be correctly superposed by the second lens system on the associated reference grating, stringent requirements are to be set to the mutual quality of the two associated wedges. These quality requirements relate to the quality of the inclined faces of the wedges and to the wedge angles.

Figure 9:
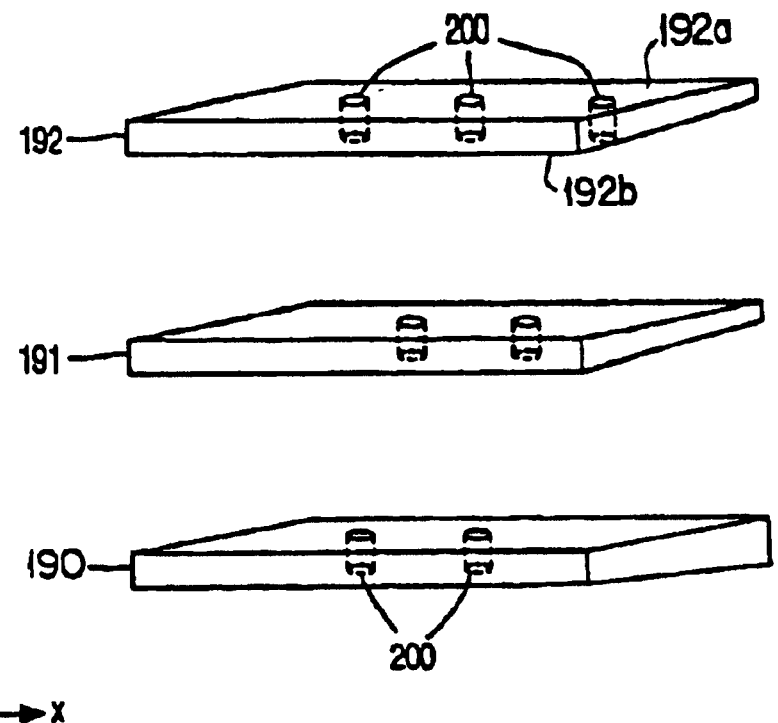
FIG. 9 shows a series of wedge-shaped plates to be used as the structure of deflection elements in a second embodiment of the alignment unit.
Figure 10:
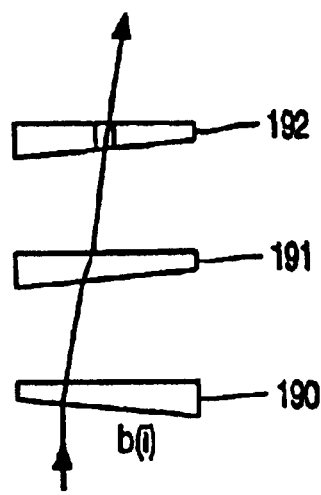
FIG. 10 illustrates how this series of wedge-shaped plates deflects a sub-beam.

To lessen said requirements and to release the tolerances of the alignment unit, preferably use is made of the structure of deflection elements shown in FIG. 9. Instead of one discrete wedge for each sub-beam a number of, for example three, wedge plates 190, 191, 192, which are common to all sub-beams, are used. FIG. 9 shows a perspective view and FIG. 9 a side view of the wedge plates. The wedge angle, i.e. the angle between the upper face and the lower face of a plate, for plate 192 the angle between the face 192a and the face 192b, are different for the three plates. One of the plates, for example plate 190, has a wedge angle which is opposite to those of the other plates. The plates are provided with a number of openings 200, only a few of which are shown in FIG. 8. These openings are arranged at positions where sub-beams are incident on the relevant plate. However, not at every such position an opening is present. If a sub-beam is incident on an opening in a plate it will not be deflected by this plate.

On its way through the plates a sub-beam will encounter, zero, one or two openings. Only the first order sub-beams encounters zero openings and is not deflected by any of the plates. In FIG. 9 the path through the plates of one of the sub-beams is shown. This sub-beam is deflected to the right by the first plate 190. Subsequently this sub-beam is deflected over a smaller angle to the left. Finally this sub-beam passes through an opening 200 in the plate 192 so that no further deflection occurs. For each of the sub-beams the number of openings and the order of the plate in which such opening is present is different from those of the other sub-beams, so that the sub-beams are all deflected in different directions. It will be clear that with a combination of three plates $2^3=8$ different deflection directions can be realized. As a pair of sub-beams of the same diffraction order is deflected by the same wedge plates, the risk that these sub-beams are not deflected in parallel directions is minimized.

In the embodiment of FIGS. 5 and 6, sub-beams with an order number of 1 to 7 are used so that seven reference gratings $G_{90}$–$G_{96}$ are necessary for the alignment in the X direction. For the alignment in the Y direction, seven sub-beams may also be used together with seven further reference gratings $G_{98}$–$G_{104}$, as is shown in FIG. 6. A second series of twelve wedges is then arranged on the wedge plate in the Y direction in the embodiment of FIG. 5. In the embodiment of FIG. 9 a second series of three wedge plates is then arranged in the path of the sub-beams before or behind the first series of wedge plates, which second series of plates deflect the sub-beams in Y-directions. The substrate mark may be the mark shown in FIG. 2 or other types of marks, e.g., marks provided along the scribe lines. For the first-order sub-beams, a similar reference grating may be used with four grating portions, two of which have a grating period of 8.0 $\mu$m, while the two other grating portions have a period of 8.8 $\mu$m as is shown in FIG. 6. The other reference gratings have only one grating period which corresponds to the relevant diffraction order of the grating portions with a period of 16 $\mu$m of the substrate grating $P_1$. The capture range of 44 $\mu$m associated with the grating mark $P_1$ of FIG. 2 is then maintained.

In the embodiment of FIGS. 5 and 6, the sub-beams having the highest order number are deflected by the deflection elements through the largest angle. However, this is not necessary. Under some circumstances, this order may be modified, for example for minimizing optical aberrations in the grating images. That may also be the reason why the sub-beams with an ascending order number are deflected by the wedges alternately at a positive angle and a negative angle, as is shown in FIG. 6.

The minimum number of diffraction orders which has to be detected to be able to align in a sufficiently accurate way at a given asymmetry of the substrate mark $P_1$ can be determined by means of computer simulations. Such simulations have proved that, for example an alignment error of 150 nm which remains when a first-order sub-beam is used can be reduced to 20 nm when a fifth-order sub-beam is used.

In principle, the maximum number of orders which can be detected is determined by the minimum intensity which can still be detected and by the numerical aperture of the lens system $L_1$, $L_2$. As is known, the intensity of the sub-beam formed by a diffraction grating quickly decreases with an increase of the order number of this sub-beam; the intensity of a sub-beam is inversely proportional to the square of the order number of this sub-beam. For a seventh-order sub-beam, the intensity is thus approximately $\frac{1}{50}$ of that of a first-order sub-beam. The intensity loss due to reflections undergone by an alignment beam when traversing the off-axis alignment unit is, however, considerably smaller than when it traverses an on-axis alignment unit. In the last-mentioned unit, the alignment beam meets, for example approximately one hundred surfaces on which reflection losses may occur and in the first-mentioned unit it meets, for example only twenty of these surfaces. If the total reflection loss is a factor of four in the off-axis alignment unit, the 7-order alignment sub-beam may have as much intensity as a 1-order alignment beam in the on-axis alignment unit.

The numerical aperture $NA_n$ which the optical system $L_1$, $L_2$ must have to pass a sub-beam with a diffraction order of N is given by:

$$NA_n = \sin\left(N \cdot \frac{\lambda}{p}\right) \quad (10)$$

For a 7-order sub-beam and a substrate grating mark with a grating period p=16 μm and a wavelength λ=544 nm, the desired numerical aperture is approximately 0.24, which is a very acceptable number.

To guarantee a sufficiently stable system, the different reference gratings are provided on a single plate RGP which preferably consists of quartz, as is shown in the embodiment of FIG. 6. The dimensions of this plate, hence the image field of the second lens system, are determined by the dimension $d_1$ of the reference gratings and their mutual distance $d_2$. This distance and dimension are, for example, both 0.2 mm so that the dimensions $d_x$ and $d_y$ in the X and Y directions of the plate RGP are 2.8 mm and the desired field diameter is approximately 3 mm.

The discrete wedges of the embodiment of FIG. 5 may be made of glass or quartz and fixed to a quartz plate. This structure shows a high degree of stability. The wedges may also be made of a transparent synthetic material, for example an UV curable plastics. In that case it is preferred to use a replication technique, known per se in optics, to print the whole wedge structure by means of a mould in one run in a thin layer of this material, which layer is applied to, for example a quartz substrate. As already remarked, instead of discrete wedges preferably wedge plates provided with openings are used. Instead of discrete wedges or wedge plates other deflection elements may be alternatively used, such as diffraction gratings of which only one order is used. Furthermore it is possible to use deflection structures constituted by patterns of refractive index variations in the material of a plate, which patterns are provided, for example by means of ion implantation.

Figure 11:
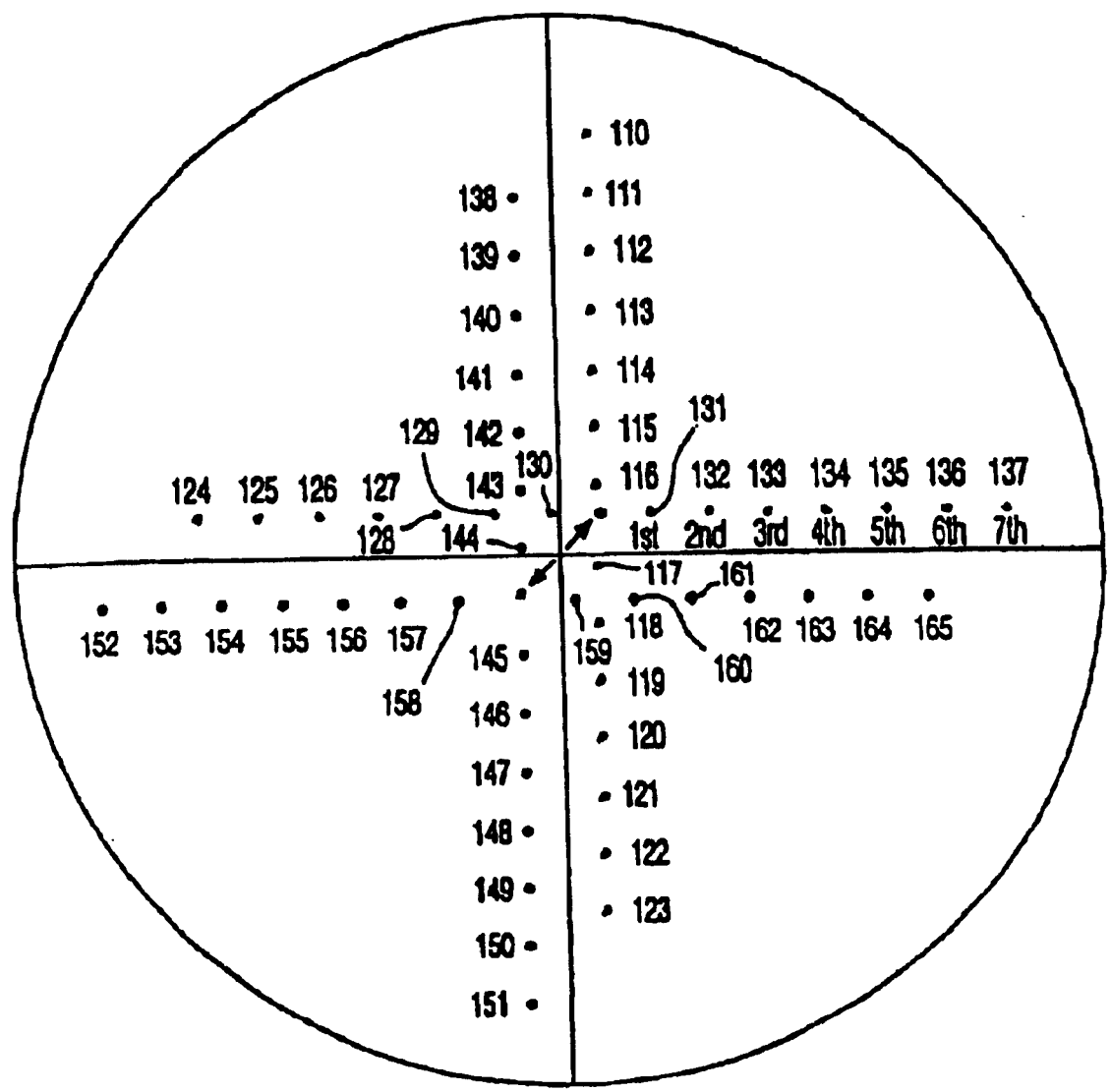
FIG. 11 shows the positions of the sub-beams in the plane of such a wedge-shaped plate in an embodiment of the alignment unit in which alignment radiation with two wavelengths is used.

In order that not too stringent requirements have to be imposed on the groove depth of the substrate mark, alignment radiation having two wavelengths, for example 633 nm and 532 nm, is preferably used. Use can be made of the fact that the angles at which the alignment grating deflects the sub-beams and the positions which these beams occupy in the rear focal plane of the lens system $L_1$ is dependent on the wavelength, as is apparent from the expressions (7) and (8). In principle, the orders for the different wavelengths can be distinguished from each other. Without further measures, however, a given order, for example the second order of the first wavelength (633 nm) may come between, for example the second and third orders of the second wavelength (532 nm). To separate the orders of the different wavelengths better from each other, it can be ensured that the beams with the different wavelengths are incident at different angles on the substrate grating $P_1$. For the case where seven diffraction orders are used, the situation as shown in FIG. 11 is then created in the rear focal plane of the lens system $L_1$. Now, there is a first cross-shaped pattern of positions 110–137 for the different orders of the first wavelength and a second cross-shaped pattern of positions 138–165 for the different orders of the second wavelength. As is shown by means of the double arrow in the center of FIG. 7, these patterns are offset with respect to each other, which is due to the different angles of incidence of the alignment beams with the different wavelengths. These angles should be maintained as minimal as possible so as to prevent alignment errors occurring due to defocusing effects. When using two wavelengths, the plate with deflection elements must of course be adapted to the situation as is shown in FIG. 11, which means, inter alia, that instead of 24 discrete wedges 48 wedges must be used, or that instead of 6 wedge-shaped plates twelve of such plates must be used.

Figure 12:
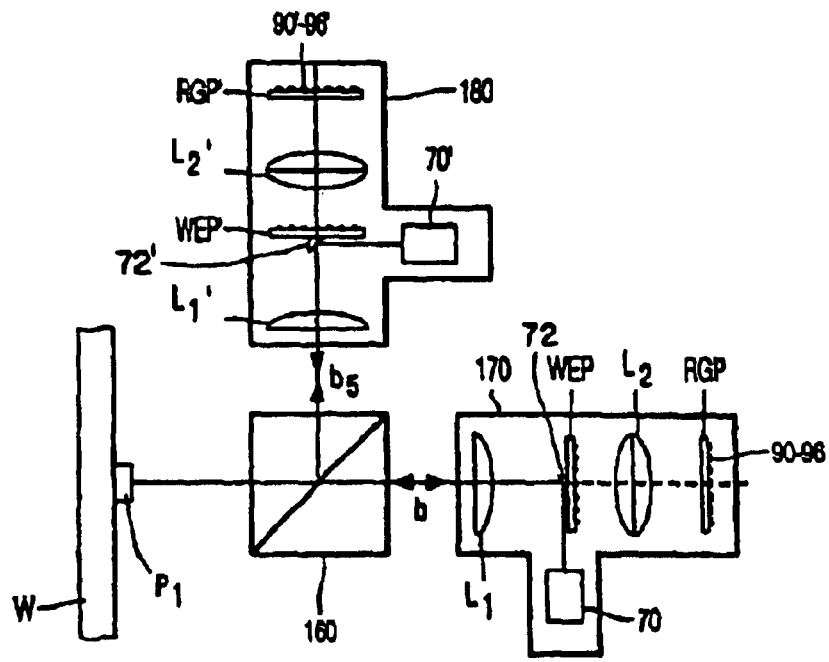
FIG. 12 shows an embodiment of the alignment unit in which two wavelengths are used.

A better alternative for the alignment with two wavelengths is illustrated in FIG. 12. In this FIG., the reference numeral 160 denotes a polarization-sensitive beam splitter. This beam splitter receives a first alignment beam b having a first wavelength $\lambda_1$, for example 633 nm, from a He—Ne laser, and having a first direction of polarization and passes this beam to the substrate alignment mark $P_1$. Incident on this beam splitter is also a second alignment beam $b_5$ which has a second wavelength $\lambda_2$, for example 532 nm and comes from a YAG laser preceding a frequency doubler. The beam $b_5$ has a direction of polarization which is perpendicular to that of the beam b so that the beam $b_5$ is reflected to the substrate mark $P_1$. It has been ensured that the chief rays of the beams b and $b_5$ are made to coincide by the beam splitter so that these beams will be passed as one beam to the mark $P_1$. After reflection by the mark, the beams b and $b_5$ are split again by the beam splitter. A separate alignment unit 170, 180 is present for each of these beams. Each of these units emits an alignment beam and receives, via the beam splitter, the sub-beams of the different diffraction orders coming from the substrate mark. In each of these units, images of the substrate mark are formed on different reference gratings and with different sub-beams, as has been described with reference to FIG. 5. To this end, each unit is provided with a lens system $L_1$, $L_2$, ($L_1'$, $L_2'$), a wedge plate WEP (WEP') and FIG. 9 or a series of wedge-shaped plates, a plate with reference gratings RGP (RGP'), a number of detectors 90–96 (90'–96') and a radiation source 70 (70') whose beam is coupled into the system via a coupling prism 72 (72').

Figure 13:
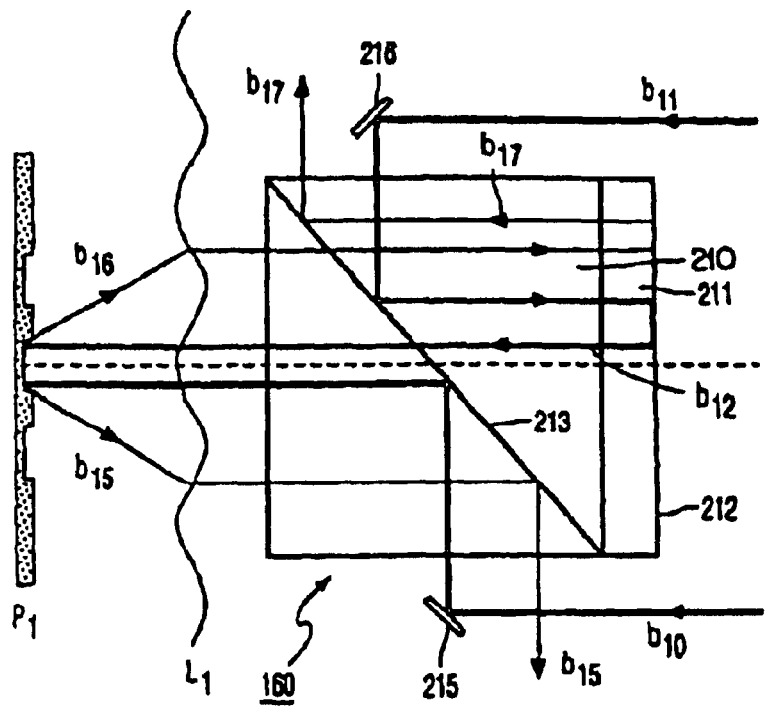
FIG. 13 shows a preferred beam splitter for use in this embodiment.

FIG. 13 shows part of an embodiment of the alignment unit wherein a special and preferred kind of beamsplitter 160 is used. This beamsplitter comprises a polarization-sensitive beam splitting prism 210, a quarter-wave plate 211 and a reflector 212. The beams $b_{10}$ and $b_{11}$ having different wavelength and coming from sources, not shown, are indicated by thick lines and the beams reflected by the grating mark $P_1$ by thin lines. The beams $b_{10}$ and $b_{11}$ have the same polarization direction. The first beam $b_{10}$ is reflected by a reflector 215 towards the polarization-sensitive beam-splitting layer 213 in the prism 210. This layer reflects the beam $b_{10}$ towards the grating mark $P_1$. The radiation reflected by the grating mark and split up in sub-beams of different diffraction orders is represented by one single beam ray $b_{15}$. The beam $b_{15}$ is reflected by the layer 213 towards the associated structure of deflection elements and detectors which are not shown in FIG. 13.

The second beam $b_{11}$ is reflected by the reflector 216 towards the beam-splitting layer 213 which reflects the beam towards the quarter-wave plate 212. After the beam $b_{11}$ has passed this plate it is reflected by the reflective layer 212 at the backside of this plate, so that it passes for a second time through the plate 211. The beam $b_{12}$ leaving the plate 211 has a polarization direction which is rotated over 90° with respect to the polarization direction of the original beam $b_{11}$. The beam $b_{12}$ can pass the beam splitting layer 213 and reach the grating mark $P_1$. The radiation reflected by this mark is also indicated by a single beam ray $b_{16}$. This beam passes first the beam-splitting layer 213, then traverses twice the quarter-wave plate 211 and finally is reflected by the layer 213 towards the associated structure of wedges and detectors, not shown in FIG. 13. It is only for clearness sake that in FIG. 13 the reflected beams $b_{16}$ and $b_{17}$ are represented as spatially separated beams; in practice these beams coincide. The same holds for the beams $b_{10}$ and $b_{11}$ at the position of the mark $P_1$.

In the embodiments of FIGS. 12 and 13 the first lens system $L_1$ is preferably arranged between the beam splitter 216 and the grating mark $P_1$, as shown in FIG. 13. This has the additional advantage that only one such lens system is needed for the two beams of different wavelengths. For the reflected beams separate second lens systems $L_2$, not shown in FIG. 13, remain necessary.

In the different embodiments described above the detectors are arranged directly behind the reference gratings. In practice however, behind the reference gratings a bundle of imaging fibers may be arranged which image each of reference gratings and the superposed image of the substrate grating mark at a detector at a remote location, which is more convenient with respect to the design of the whole apparatus and with respect to the performance of this apparatus. For example, cross-talk between the images formed by the sub-beams of the different diffraction orders can be decreased and heat generated by signal amplifiers and electronic processors can be kept away from the alignment unit and the apparatus. Also the radiation sources may be arranged at positions remote from the alignment unit and their radiation can also be guided to the unit by an illumination bundle of fibers. In this way the heat generated by the radiation sources can be kept away from the alignment unit and the lihographic apparatus.

Between the prism 216 and the second lens system L2 for one of the beams $b_{15}$ and $b_{17}$ a partially transmitting reflector may be arranged to split-off a portion of this beam towards a camera which, together with a monitor, provides a visual image of the substrate mark to an operator of the apparatus.

There are different possibilities of using the various detector signals. A start may be made with the alignment by means of the first-order sub-beams by processing the signals of the detectors associated with these sub-beams. Subsequently, the signals of the detectors associated with the second-order sub-beams may be used for finer alignment, then the signals of the detectors associated with the third-order sub-beams may be used for even finer alignment, and so forth. This may continue as long as the sub-beams used still have sufficient intensity to be detected in a reliable manner.

Another possibility is based on the recognition that the intensity of certain diffraction orders is increased at the expense of other diffraction orders when given process layers are provided on the substrate. In that case, a direct choice of the preferred orders may be made for the alignment. Under circumstances, said possibilities may also be combined.

Hitherto, only the alignment of the substrate with respect to an apparatus reference in the form of reference gratings has been described. With the same alignment unit also the position of the substrate holder or table can be determined. To that end this holder or table is provided with an alignment mark similar to the substrate alignment mark. (See, e.g., the fiducial mark illustrated schematically in FIG. 4) The position of the substrate holder mark with respect to the reference in the alignment unit is determined. The position of the substrate mark with respect to the substrate holder mark is then known. To be able to fix the mutual position of the mask pattern and the substrate, a further measurement is necessary, namely that of the position of the mask pattern with respect to the substrate holder or table. For this further measurement, the on-axis alignment unit described with reference to FIGS. 1, 2 and 3 may be used, with which mask marks are aligned with respect to marks of the substrate holder. Not only the double alignment unit as shown in FIG. 3 but also a single alignment unit as described in U.S. Pat. No. 4,251,160 may be used.

Figure 14:
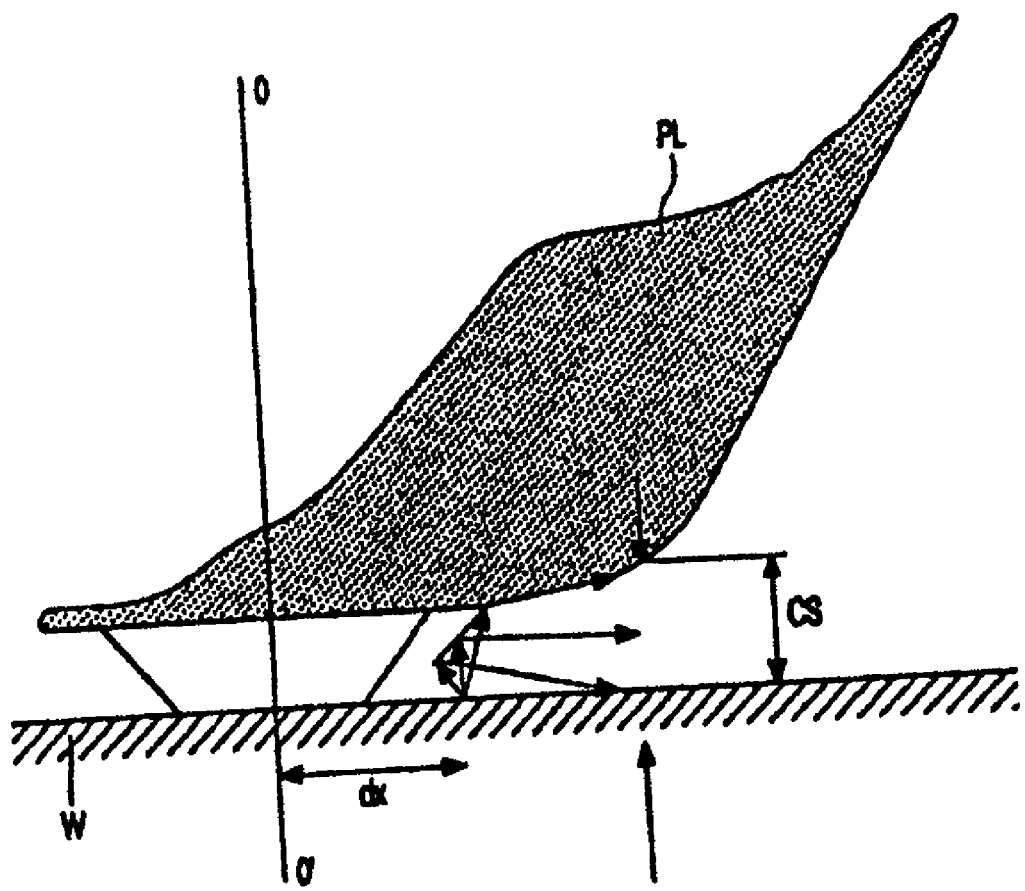
FIG. 14 shows the position of the alignment unit with respect to the projection lens and the substrate.

Another possibility of aligning the mask pattern with respect to the substrate table is the use of the image sensor unit described in, for example U.S. Pat. No. 4,540,277. In such a unit, a mask alignment mark is imaged by means of projection radiation on a corresponding and transmissive reference mark in the substrate table. In this table, a detector may be arranged behind the reference mark for converting the radiation passed by the reference mark into an electric signal. In the first instance, this image sensor unit is intended for, for example calibrating an on-axis alignment unit which operates with alignment radiation having a wavelength which is considerably different from that of the projection radiation, or for checking the image quality of the image formed by the projection lens system and for measuring distortions and aberrations which may occur, but it is also eminently suitable for aligning the mask pattern with respect to the substrate table. Instead of the transmission image sensor unit described in U.S. Pat. No. 4,540,277, an image sensor unit operating in reflection may be alternatively used for aligning a mask mark with respect to a substrate table mark. Such a unit, which is described in U.S. Pat. No. 5,144,363, operates with a reflective mark on the table and comprises a relatively large number of detectors which observe the mark at different angles and which, together with the associated optical systems, are provided in a sensor plate which is arranged between the projection lens system and the substrate table. The off-axis alignment unit according to the invention must also be provided in this space. This unit must be arranged as close as possible to the center of the substrate table and requires a building space which is conical with an aperture of, for example 0.3. In practice, the length of the Y slide of the substrate table approximately corresponds to the radius of the substrate for which the lihographic apparatus has been designed, for example 102 mm for an 8-inch substrate, so that there is little room for building in the alignment unit in this direction. The X slide of the substrate table is, however, for example 25 mm longer than the Y slide, so that an alignment unit which can handle an 8-inch substrate can be placed at a distance of 25 mm from the optical axis of the projection lens system. This is shown very diagrammatically in FIG. 14 which shows a part of the projection lens system PL and its optical axis OO'. A portion between the projection lens system and the substrate is a space which is occupied by the projection beam, and the arrows marked b indicate sub-beams of the alignment radiation. The alignment beam is incident on the substrate at a distance dx from the axis OO' which distance is thus, for example 25 mm. The reference CS denotes the critical position for the available building space. At this position, the diameter of the cone within which the sub-beams with the different diffraction orders are situated is equal to the distance to the substrate, multiplied by twice the value of the numerical aperture. For a numerical aperture of 0.25 and a value of 32 mm for said distance, said diameter, hence the required vertical space at the location of CS, is 16 mm. This is a reasonable requirement in practice. However, this vertical space may not be completely available. In that case, two off-axis alignment units may be used which are arranged diametrically with respect to each other and can each cover a part of the substrate.

As hitherto described the off-axis alignment unit is arranged in the projection column, comprising the mask holder, the projection system and the substrate holder, of the lithographic apparatus. With the increasing demand for larger IC's having smaller details, and thus comprising more electronic components, the alignment procedure becomes more and more time-consuming. The throughput of these apparatuses therefore tends to decrease without further measures taken. It has already been proposed to add to such an apparatus a separate measuring station. In this station the position in, for example the X-, Y- and Z-direction, of a substrate is measured before this wafer is brought in the projection column, or projection station. In the measuring station substrate marks can be aligned with respect to alignment marks on the substrate holder or table. After the substrate, together with the holder has been placed in the projection system, only a mask alignment mark needs to be aligned with respect to the substrate holder mark, which takes only a short time. As in the apparatus, comprising a separate measuring station and projection station, during the illumination of a first substrate in the projection station a second substrate is being measured in the measurement station, the throughput of this apparatus is considerably larger than in an apparatus without a separate measurement station. The alignment unit used in the measuring station for aligning a substrate mark with respect to a substrate holder mark is preferably an off-axis alignment system as described herein.

According to this invention, the position of an alignment mark can be determined utilizing information from two wavelength channels in a detection system. As noted above, alignment of a substrate during manufacture is often performed by determining positions of alignment marks which are often a series of grooves formed in or on the substrate. For example, the alignment mark may be a phase grating in which alignment light reflected from bottom portions of the grooves have a phase difference with respect to light reflected from top portions of the grooves due to the optical path length difference between the two optical paths. Such an alignment mark undergoes changes during processing of the device on the substrate. Such processing may result in changes in the effective depth of the phase gratings due to processing steps such as CMP and/or deposition of layers of material over the grating. The intensity of light from such a mark has a minimum when the depth of the grooves is a multiple of one-half the effective wavelength in resist. This may result in a loss or degrading of an alignment signal for a given alignment mark at certain stages of processing devices. One approach to solve this problem is to illuminate the alignment mark on the substrate with alignment light that has at least two wavelengths (see FIG. 12). For example, one may illuminate an alignment mark with a red laser that has a wavelength of 633 nm and a green laser having a wavelength of 532 nm.

Figure 15:
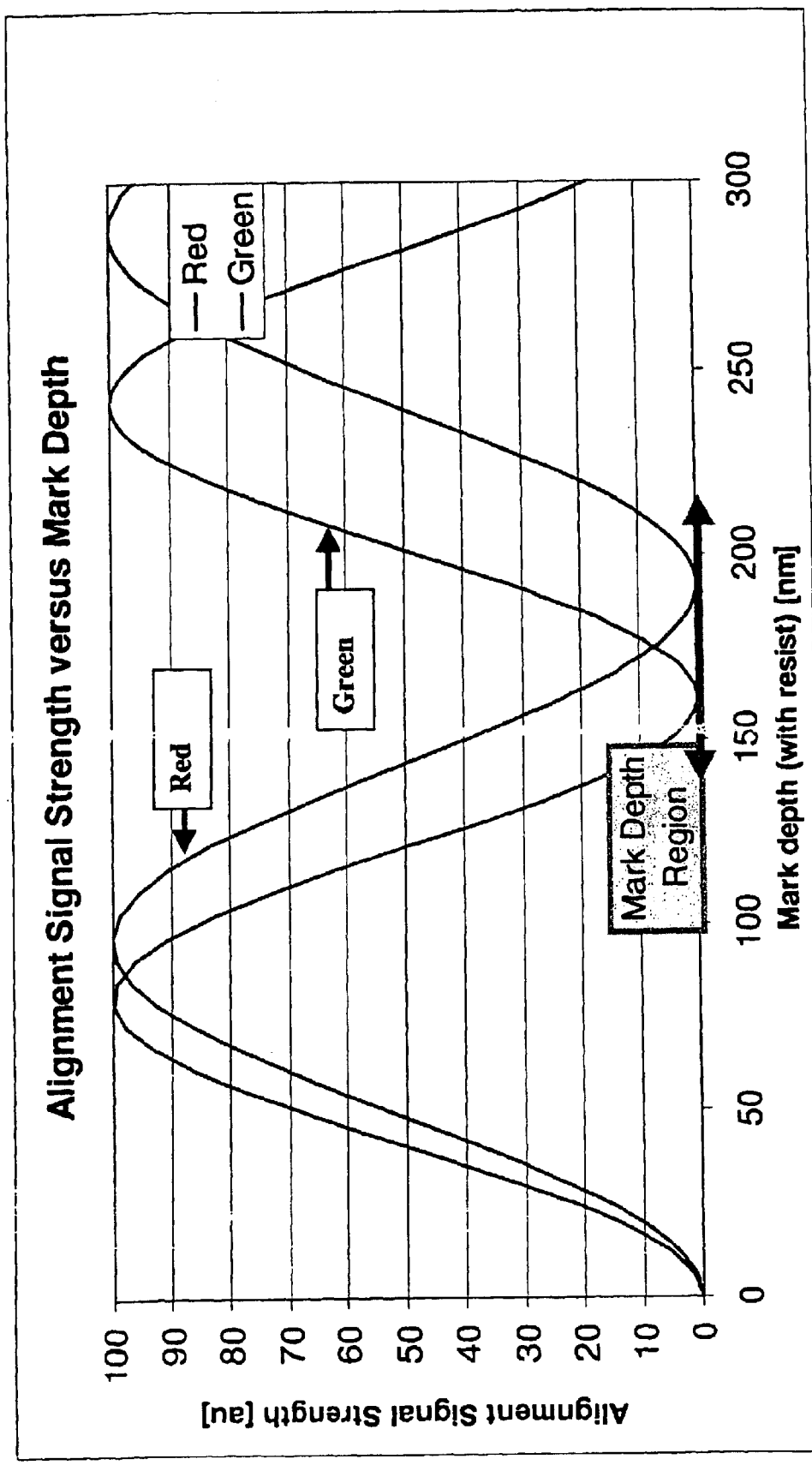
FIG. 15 shows an example of alignment signal strength as a function of mark depth for red (633 nm) and green (532 nm) alignment radiation.

FIG. 15 illustrates alignment signal strength as a function of an alignment mark depth for such red and green laser wavelengths. Note that there are regions in which the signal strength at one wavelength is substantially stronger than the signal strength at the other wavelength. For example, the red signal strength at around 150 nm, or slightly less, is relatively strong compared to the green signal strength. In contrast, the green signal strength at about 210 to 220 nm is strong relative to the red signal strength. In one approach, one may base the alignment process on whichever signal strength is stronger. This approach of switching from a signal corresponding to one illuminating wavelength to another illuminating wavelength will be referred to as Alignment Signal Strength Digital Wavelength Switching or ASSDWS. In an embodiment, this is implemented in the SPU and/or Position Determining Unit illustrated in FIGS. 1 and 4 above. Alignment Signal Strength Digital Wavelength Switching leads to improved alignment results over significant ranges of mark depths. In this embodiment the signal strength is the relative signal strength with respect to a reference. Within the scope of this invention the signal strength can also be the absolute signal strength or the modulation depth of the signal or the physical amplitude of the signal. According to this invention, further improvements in alignment accuracy and precision may be obtained by combining information from both signals at the two different wavelengths. Although FIG. 15 illustrates the example of red and green illumination wavelengths from conveniently available lasers, the broad concept of this invention is not limited to particular values of the wavelengths.

Figure 16:
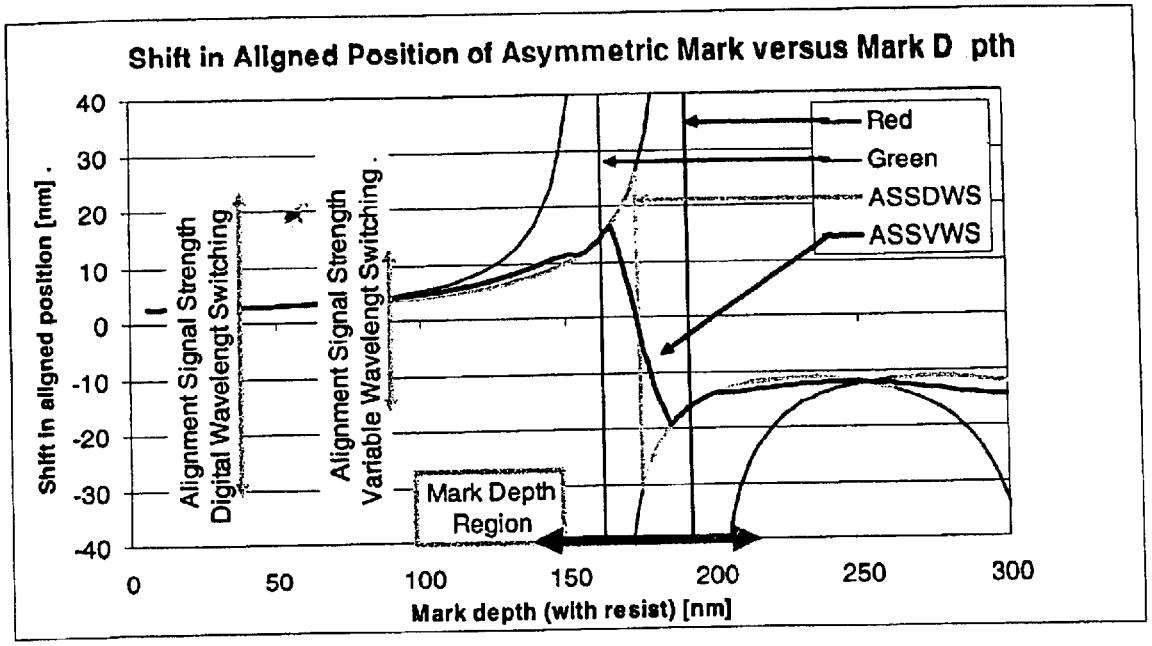
FIG. 16 shows shift in aligned position of an asymmetric mark versus mark depth along with Alignment Signal Strength Digital Wavelength Switching and Alignment Signal Strength Variable Wavelength Switching approaches.

FIG. 16 illustrates the shift in alignment position of asymmetric alignment marks as a function of the depth of the alignment mark. The asymmetry can be introduced by wafer processing such as CMP, etching, resist spinning, STI. Alignment Signal Strength Digital Wavelength Switching or ASSDWS can be used for marks with depth range between 150 and 200 nm, but there is a discontinuity intermediate between 150 and 200 nm in which the shift in alignment position goes from a maximum positive value to a negative minimum value in a discontinuous, sudden change. FIG. 16 also illustrates an embodiment in which the signals from both wavelengths are used together to determine the position of the alignment mark. To enhance the alignment performance and accuracy for asymmetric marks with mark depth varying between 150 and 200 nm the information from both signals at the two different wavelengths are combined. The signal strength can be used as a weight factor to reduce the range in shift in aligned positions, but this also incorporates the use of a portion of the aligned position information of a wavelength with virtually no signal strength, having a significant contribution to the inaccuracy of the combined aligned position. To be able to combine the positional information for improved positioning performance without losing performance in accuracy, an extra parameter is used in the calculation.

The signal from the two different wavelengths may be combined in many ways within the scope of this invention. Generally, the position determining unit uses information from signals from the two wavelength channels, taken substantially in parallel. In embodiments of this invention, the position determining unit also uses a selectable parameter. In some cases, the signals in one wavelength channel may be deemed unreliable or inaccurate relative to the other channel so that the system selects to use only the most reliable or most accurate signal. In other cases, the signals may be combined to provide a determination of the position of the alignment mark.

In an embodiment of the invention, the weight factors for combining the signals at the two wavelengths are taken to be a function of the measured signal strength at the first wavelength and the measured signal strength at the second wavelength. In addition, the weight factors according to this embodiment of the invention, that will be referred to as Alignment Signal Strength Variable Wavelength Switching or ASSVWS, also depend on a Maximum Relative Threshold MRT factor which may be selected by the user. In this embodiment, the weighting factors for each of the red and green signals is expressed by the following formula:

$$WeightFactor_{Green} = \frac{(MRT+1) \cdot \left(\frac{SS_{Green}}{SS_{Green}+SS_{Red}}\right) - 1}{MRT - 1} \quad (11)$$

$$WeightFactor_{Red} = \frac{(MRT+1) \cdot \left(\frac{SS_{Red}}{SS_{Green}+SS_{Red}}\right) - 1}{MRT - 1}$$

In an extension to this embodiment the signal strength is corrected for the (relative) reflectivity of the materials on the wafer surface to ensure an optimal combination of the wavelength channels, as is expressed by the following formula:

$$WeightFactor_{Green} = \quad (12)$$
$$\frac{(MRT+1) \cdot \left(\frac{WR_{Green} \cdot SS_{Green}}{WR_{Green} \cdot SS_{Green} + WR_{Red} \cdot SS_{Red}}\right) - 1}{MRT - 1}$$

$$WeightFactor_{Red} =$$
$$\frac{(MRT+1) \cdot \left(\frac{WR_{Red} \cdot SS_{Red}}{WR_{Green} \cdot SS_{Green} + WR_{Red} \cdot SS_{Red}}\right) - 1}{MRT - 1}$$

In addition, the weight factors are modified in the cases when they exceed a value of 1. If they exceed a value of 1, they are set equal to 1. In addition, the weight factors are not permitted to become negative. In other words, if either weight factor is calculated to be less than 0 from equation 11, it is set to be equal to 0. In equation 11 or 12, the Maximum Relative Threshold factor MRT may be selected by the user (MRT>1). The variable $SS_{green}$ is the signal strength for the green signal and $SS_{red}$ is the signal strength for the red signal. The variable $WR_{green}$ is the relative wafer reflectivity for the green wavelength with respect to a reference and $WR_{red}$ is the relative wafer reflectivity for the red wavelength with respect to a reference.

Figure 17:
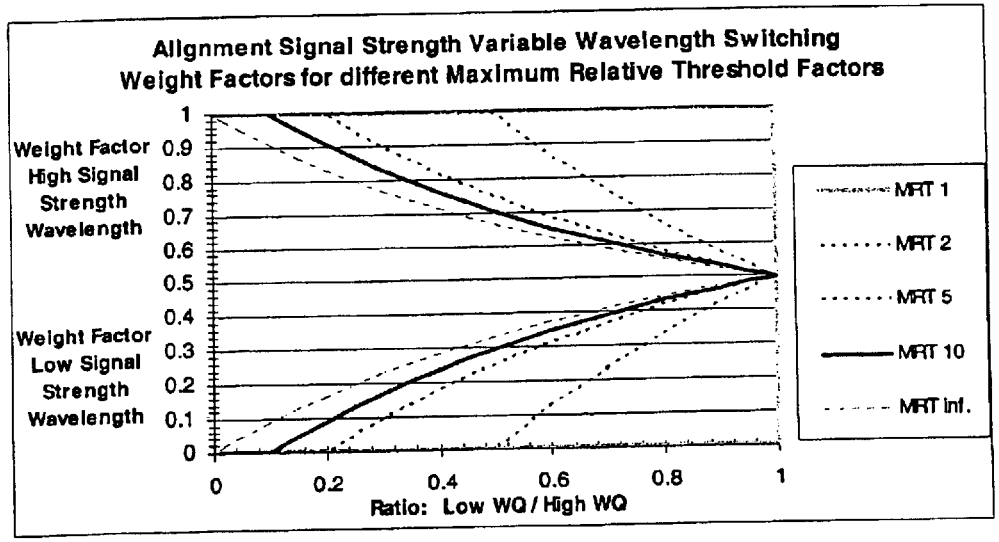
FIG. 17 shows Alignment Signal Strength Variable Wavelength Switching weight factors for several values of the MRT factor (selectable threshold).

FIG. 17 illustrates the weight factors according to this embodiment of the invention for several different values of the Maximum Relative Threshold factor MRT. Notice that when the weight factor of one wavelength channel reaches a value of 1, only that wavelengths is used to determine the position of the alignment mark, as the corresponding weight factor for the other wavelength is 0. In the case where the Maximum Relative Threshold factor goes to infinity, both wavelengths are always used to determine the position of the alignment mark. However, for finite values of the Maximum Relative Threshold factor, there are regions in which a signal at only one of the wavelengths is used to determine the alignment mark and regions in which only the other of the signals is used to determine the position of the alignment mark. In addition, there are intermediate regions in which signals from both wavelengths are combined in order to determine the position of the alignment mark. The Maximum Relative Threshold factor MRT is the maximum value allowed for the ratio of the signal strength from the wavelength channel with the highest signal strength to the other signal strength to use the combination of both wavelength channels to determine the position of the alignment mark. If the ratio is larger than the MRT (a threshold), the channel with the lowest signal is disregarded. There is a gradual transition between the area where both channels are used and the area where only one channel is used to determine the position of the alignment mark. Notice from equation 11 that the sum of the red and green weight factors is always equal to 1, except when one of the signal strengths is zero, in this case only the wavelength with the highest signal strength is used. One may also compare the ratio of the signal strengths to the MRT factor to identify the cases in which only one of the two wavelength channels is used in determining the position of the alignment mark, before calculation of the weight factors with formula 11. For example, when the signal strength of the red signal divided by the signal strength of the green signal is greater than or equal to the MRT factor, then the weight factor for the red signal is chosen to be equal to 1 (one) and the weight factor for the green signal is chosen to be equal to zero. Similarly, when the signal strength of the green signal divided by the signal strength of the red signal is greater than or equal to the MRT factor, then the weight factor for the red signal is equal to zero and the weight factor for the green signal is equal to 1. It is possible to use an absolute threshold instead of the discussed relative threshold, but it is preferred to use an absolute threshold in combination with the relative threshold for increased security on alignment marks with low reflectivity. On marks with low reflectivity the relative signal strength of the wavelengths may still be within the specified Maximum Relative Threshold, but the absolute signal strength of the wavelength with the lowest signal strength may indicate that the aligned position of this wavelength channel is unreliable and unfit to use for the alignment mark position determination.

FIG. 16 illustrates an example of the shift in aligned position as a function of the alignment mark depth for Alignment Signal Strength Variable Wavelength Switching based on this embodiment of the invention as contrasted with a Alignment Signal Strength Digital Wavelength Switching case in which only an abrupt change from one signal at one wavelength to the other signal at the other wavelength occurs. Notice the reduced range in shift in aligned position for Alignment Signal Strength Variable Wavelength Switching as compared to the case of Alignment Signal Strength Digital Wavelength Switching and the graded transition in the region intermediate between 150 and 200 nm in the example illustrated in FIG. 16. Notice that the unreliable position of the wavelength channel with signal strength (almost) 0 is never used to determine the position of the alignment mark. Alignment Signal Strength Variable Wavelength Switching gives good results for asymmetric alignment marks, but its use is not limited to that. Improved performance is also noticeable on symmetric alignment marks with varying mark depth. This is because of the efficient way of ASSVWS to use a larger amount of reliable information as compared to the case of ASSDWS, while not using the unreliable information. The use of larger amounts of reliable information gives a statistical benefit.

In case any offsets between the position determined by the first wavelength channel and the position determined by the second wavelength channel exists, possibly caused by drift of the sensors or inaccurate calibration or in any other way, ASSVWS provides a gradual transition, while ASSDWS shows an unwanted sudden jump when switching from one wavelength to another wavelength.

In another embodiment, instead of providing a gradual position transition when switching between multiple wavelength channels, the frequency of wavelength switching is reduced, hence providing a more stable use of the detection system while switching capabilities are still possible. This is especially useful to automatically adapt to slow changes in the IC manufacture process, such as aging of components or tuning of layer thickness. In one embodiment, one of the wavelengths is marked as the preferred wavelength and switching to another wavelength is only allowed if the ratio of the signal strength of the other wavelength with respect to the signal strength of the preferred wavelength exceeds the Relative Switch Threshold Ratio RSTR. This embodiment always keeps one wavelength the preferred wavelength and, depending on the value of the user defined RSTR, most or virtually all of the aligned positions are determined with the preferred wavelength. In an extension to this embodiment hysteresis is introduced so that the preferred first wavelength is used until the ratio of the signal strength of the second wavelength with respect to the signal strength of the preferred first wavelength exceeds the Relative Switch Threshold Ratio RSTR. At that moment the preference is transferred from the first wavelength to the second wavelength, making the second wavelength the preferred wavelength. This reduces the probability of switching back to the first wavelength in the next alignment, thus hysteresis helps reducing the number of wavelength switches even further. The preference can also be transferred from one wavelength to the other wavelength on other grounds, for example based on historical data.

Although the weight factor in the ASSVWS embodiment is given by equations 11 and 12 and limited to have a maximum value of 1 and a minimum value of zero, the broad concepts of this invention are not limited to only that embodiment. This invention envisions combining information from the plurality of wavelength channels in a variety of ways. The weighting factors in equations 11 and 12 depend on the signal strength and include a selectable Maximum Relative Threshold factor. One may select weighting factors which depend on other measurable quantities without departing from the scope of this invention. The preferred wavelength embodiment also depends on the signal strength and includes a selectable Relative Switch Threshold Ratio. One may select transition requirements which depend on other measurable quantities without departing from the scope of this invention.

For example, the use of other input parameters, such as "mcc", "minirepro", "signal to noise ratio", "signal shape", "signal envelope", "focus", "tilt", "order channels position offset", "wavelength channels position offset", "shift between segments" and/or "coarse-fine position deviation", possibly in combination with user input parameters, can enhance the performance.

Many of these parameters are related to the accuracy of the aligned position determination. The parameter "mcc" is the multiple correlation coefficient indicating how well the measured signal resembles the signal expected for a perfect alignment mark; the "minirepro" is the standard deviation of the aligned position of different sections or portions of an alignment measurement, indicating the accuracy of the aligned position; the "signal to noise ratio" is the fitted signal divided by the relative level of noise across the spectrum of the measured signal, while the "signal shape" is the relative level of a few discrete frequencies in this spectrum, generally at multiples of the base frequency; the "signal envelope" is variance of the signal strength during the measurement; the "focus" is the offset in wafer height during the measurement; the "tilt" is the angle between the wafer angle and the detector angle during the measurement; "order channels position offset" is the measured difference in aligned position of the various channels of one wavelength; the "wavelength channels position offset" is the measured difference in aligned position of the various wavelength channels; the "shift between segments" is the measured difference in aligned position of the various segments of a multi segmented alignment mark; and the "coarse-fine position deviation" is the difference between the position of the alignment marks in the fine phase with respect to their expected position based on alignment mark measurements in the coarse phase.

The alignment system according to the current invention may be implemented in a variety of alignment apparatuses. In a specific example, it may be implemented in the alignment system illustrated in FIGS. 3, 5, 7, 12 and 13. In this example, the alignment system has a position determining unit. In general, the position determining unit may be either a hardwired special purpose component or may be a programmable component. In a programmable unit, the position determining unit comprises a CPU, memory and data storage area. In addition, the position determining unit will have I/O ports for communicating with other equipment and/or interfacing with users.

In this embodiment, signals for seven diffraction orders may be detected for each of the X and Y positions and for each of the two wavelengths of the alignment radiation. The information from signals of the same order but different wavelengths may be combined according to this invention and either a single order or multiple orders used to make the final position determination of the mark. In cases using multiple orders, the weight factors can best be determined per order separately.

The position of the alignment mark may be determined on a mark-by-mark basis as the measurements are performed, resulting in one aligned position per alignment mark. Alternatively, input parameters such as the above noted input parameters may be obtained for all alignment marks on the wafer and then the grid calculation may be performed without calculating an aligned position per alignment mark. This permits one to gather data from a plurality of alignment marks so that the relative signal strength, or other input parameters, between different alignment marks on the wafer can be taken into account. The aligned positions are weighted in the grid calculation so that the calculated grid represents the wafer position more accurately as alignment marks with higher signal strength are more accurately measured and weighted more heavily in the grid calculation. The grid calculations can be performed for individual wavelengths or a combination of wavelengths. The weight factor is determined by the relative signal strength, or any other input parameter, between different alignment marks on the wafer.

Extra input parameters can be used in the grid calculation, such as "grid residuals," "non-orthogonality," "X-Y expansion difference" and "wafer expansion." All these parameters give an indication of the accuracy of the aligned position determination and are therefore valuable input parameters for the weight factor in the grid calculations.

Grid residuals are the deviations from the measured alignment mark positions to the fitted wafer grid, thus being a measure for the accuracy of the alignment mark position determination; non-orthogonality and X-Y expansion difference are both measures of the deformation of the wafer, but can, like grid, residuals be used as a measure for the accuracy of the alignment mark position determination as these deformations are generally much less than the alignment mark position deviations; and wafer expansion is a measures of the expansion and therefore of the temperature of the wafer, this temperature is well controlled and therefore the wafer expansion can be used as a measure for the accuracy of the alignment mark position determination. In addition, this approach permits one to calculate an optimum grid in one step without calculating the individual aligned positions per alignment mark, offering more flexibility in combining the various input parameters of the measured alignment marks on the wafer and the extra grid parameters mentioned above.

In an extension to this embodiment it is useful to determine an optimum grid per wafer, the variation of the input parameters per alignment mark and the input parameters per wafer can be used as extra input parameters. The use of historic data gives an indication of variations in processing being temporary fluctuations or a long term trend. The variation of such parameters within a batch is data typically stored on current lithography apparatuses, while batch to batch variation may be obtained with a link to an automatic process control (APC) apparatus. Historic data can be stored for individual wavelengths or a combination of wavelengths.

Since the numerous systems described above use coherent alignment radiation sources, the phase modulation techniques described in U.S. Pat. No. 6,384,899 may also be used in combination with the systems described herein. The entire content of the U.S. Pat. No. 6,384,899 is hereby incorporated herein by reference in its entirety. The invention is described with reference to its use in apparatus for step-and-scan imaging of a mask pattern on a substrate for manufacturing ICs, but this does not mean that it is limited thereto. The invention may be alternatively used in such an apparatus for manufacturing integrated, or plenary, optical systems, guidance and detection patterns for magnetic domain memories, or liquid crystalline display panels, thin-film magnetic heads, MEMS devices, etc. The lihographic apparatus may not only be an optical apparatus, in which the projection beam is a beam of electromagnetic radiation and the projection system is an optical projection lens system, but also an apparatus in which the projection beam is a charged-particle beam such as an electron beam, an ion beam or an X-ray beam, in which an associated projection system, for example an electron lens system is used. Generally, the invention may be used in imaging systems with which images having very small details must be formed.

We claim:

1. An alignment system for a lithographic apparatus, comprising:
   a source of alignment radiation having a first wavelength and a second wavelength;
   a detection system comprising a first wavelength channel arranged to receive alignment radiation from an alignment mark at said first wavelength and a second wavelength channel arranged to receive alignment radiation from said alignment mark at said second wavelength; and
   a position determining unit in communication with said detection system,
   wherein said position determining unit processes information from said first and second wavelength channels in combination to determine a position of said alignment mark based on one of information from said first wavelength channel, information from said second wavelength channel and combined information from said first and second wavelength channels according to a relative strength of said alignment radiation detected at said first wavelength to alignment radiation detected at said second wavelength.

2. An alignment system according to claim 1, wherein said position determining unit is constructed to process said information from said first and second wavelength channels by weighting first and second signals from said first and second wavelength channels with factors that depend on a relative strength of said first signal to said second signal.

3. An alignment system according to claim 2, wherein the weight factor for said second wavelength channel is set to zero when a strength of said first signal relative to said second signal exceeds a predetermined threshold.

4. An alignment system according to claim 1, wherein said source of alignment radiation comprises a first laser that generates radiation at said first wavelength and a second laser that generates radiation at said second wavelength.

5. An alignment system according to claim 1, wherein said position determining unit is constructed to assign weight factors to said first and second wavelength channels that depend on signal strengths of said first and second wavelength signals.

6. An alignment system according to claim 1, wherein said first wavelength channel of said detection system corresponds to a first diffraction order sub-beam at said first wavelength,
   said second wavelength channel of said detection system corresponds to a first diffraction order sub-beam at said second wavelength, and
   said position determining unit determines said position of said alignment mark based on said first and second wavelength signals with a first precision.

7. An alignment system according to claim 1, wherein said detection system further comprises a third signal channel at said first wavelength and a second diffraction order sub-beam at said first wavelength, and a fourth signal channel at said second wavelength and a second diffraction order sub-beam at said second wavelength, and
   said position determining unit determines said position of said alignment mark based on said first and second wavelength signals with a second precision that is more precise than said first precision.

8. An alignment system according to claim 1, wherein said first wavelength channel of said detection system corresponds to a first diffraction order sub-beam at said first wavelength, a value of said diffraction order sub-beam at said first wavelength being dynamically selected based on processing said substrate had undergone, and
   said second wavelength channel of said detection system corresponds to a first diffraction order sub-beam at said second wavelength, a value of said diffraction order sub-beam at said second wavelength being dynamically selected based on processing said substrate had undergone.

9. An alignment system according to claim 2, wherein said position determining unit processes said information from said first and second wavelength channels by further assigning a selectable parameter to combine information from said first and second wavelength signals.

10. An alignment system according to claim 9, wherein said selectable parameter eliminates information from said first wavelength signal from said position determination when said first wavelength signal fails to satisfy a selectable level of reliability.

11. An alignment system according to claim 9, wherein said selectable parameter eliminates information from said first wavelength signal from said position determination when said first wavelength signal fails to satisfy a selectable level of precision.

12. An alignment system according to claim 9, wherein said selectable parameter is determined prior to said assigning said weights.

13. An alignment system according to claim 9, wherein said selectable parameter is determined after to said assigning said weights.

14. An alignment system according to claim 2, wherein said weighting factors assigned to said first and second wavelength signals that depend on said first and second signal strengths further depend on a selectable threshold value, said weighting factors being constrained to be within a range from zero to one, inclusive.

15. An alignment system according to claim 14, wherein said weighting factors assigned to said first and second wavelength signals that depend on said first and second signal strengths further depend on a reflectivity of said substrate or a material on said substrate at each of said first and second wavelengths.

16. An alignment system according to claim 14, wherein said selectable threshold value is a relative threshold, relative to a selected value of a signal strength.

17. An alignment system according to claim 14, wherein said selectable threshold value is an absolute threshold.

18. An alignment system according to claim 16, wherein said weighting factors assigned to said first and second wavelength signals that depend on said first and second signal strengths further depend on a selectable absolute threshold value.

19. An alignment system according to claim 2, wherein said weighting factors assigned to said first and second wavelength signals are assigned such that said first wavelength signal is preferred over said second wavelength signal.

20. An alignment system according to claim 19, wherein said weighting factors of said first and second wavelength signals are reassigned such that said second wavelength signal is preferred over said first wavelength signal subsequent to said second wavelength signal dominating over said first wavelength signal when said weighting factors were previously assigned such that said first wavelength signal was preferred over said second wavelength signal, leading to a hysteresis effect.

21. An alignment system according to claim 19, wherein said weighting factors assigned to said first and second wavelength signals are reassigned such that said second wavelength signal is preferred over said first wavelength signal based on predetermined criteria.

22. An alignment system according to claim 1, wherein said position determining unit is constructed to process said information from said first and second wavelength channels by weighting first and second signals from said first and second wavelength channels with factors that depend on at least one measurable quantity selected from the set of measurable quantities consisting of mcc, minirepro, signal-to-noise ratio, signal shape, signal envelope, focus, tilt, order channels position offset, wavelength channels position offset, shift between segments and coarse-fine position deviation, wherein the parameter mcc is a multiple correlation coefficient indicating how well the measured signal resembles the signal expected for a perfect alignment mark, minirepro is a standard deviation of the aligned position of different sections or portions of an alignment measurement, indicating the accuracy of the aligned position, signal to noise ratio is the fitted signal divided by the relative level of noise across the spectrum of the measured signal, while the signal shape is the relative level of a few discrete frequencies in this spectrum, generally at multiples of the base frequency; the signal envelope is variance of the signal strength during the measurement, the focus is the offset in wafer height during the measurement, the tilt is the angle between the wafer angle and the detector angle during the measurement, order channels position offset is the measured difference in aligned position of the various channels of one wavelength, the wavelength channels position offset is the measured difference in aligned position of the various wavelength channels, the shift between segments is the measured difference in aligned position of the various segments of a multi segmented alignment mark, and the coarse-fine position deviation is the difference between the position of the alignment marks in the fine phase with respect to their expected position based on alignment mark measurements in the coarse phase.

23. An alignment system according to claim 2, wherein said weighting factors assigned to said first and second wavelength signals are selected in accordance with a diffraction order that is detected.

24. A lithographic apparatus, comprising:

an illumination system;

a substrate stage assembly arranged in a radiation path of illumination radiation from said illumination system;

a reticle stage assembly arranged in said radiation path of said illumination radiation between said illumination system and said substrate stage assembly;

a projection system arranged between said reticle stage assembly and said substrate stage assembly; and an alignment system arranged proximate at least one of said substrate stage assembly and said reticle stage assembly, wherein said alignment system comprises:

a source of alignment radiation having a first wavelength and a second wavelength;

a detection system comprising a first wavelength channel arranged to receive alignment radiation from an alignment mark at said first wavelength and a second wavelength channel arranged to receive alignment radiation from said alignment mark at said second wavelength channel; and a position determining unit in communication with said detection system, wherein said position determining unit processes information from said first and second wavelength channels in combination to determine a position of said alignment mark based on one of information from said first wavelength channel, information from said second wavelength channel and combined information from said first and second wavelength channels according to a relative strength of said alignment radiation detected at said first wavelength to alignment radiation detected at said second wavelength.

25. A lithographic apparatus according to claim 24, wherein said position determining unit is constructed to process said information from said first and second wavelength channels by weighting first and second signals from said first and second wavelength channels with factors that depend on the relative strength of said first signal to said second signal.

26. A lithographic apparatus according to claim 25, wherein the weight factor for said second channel is set to zero when a strength of said first signal relative to said second signal exceeds a predetermined threshold.

27. A lithographic apparatus according to claim 24, wherein said source of alignment radiation comprises a first laser that generates radiation at a first wavelength and a second laser that generates radiation at a second wavelength.

28. A lithographic apparatus according to claim 24, wherein said position determining unit is constructed to assign weight factors to said first and second wavelength channels that depend on signal strengths of said first and second wavelength signals.

29. A lithographic apparatus according to claim 24, wherein said first wavelength channel of said detection system corresponds to a first diffraction order sub-beam at said first wavelength, said second wavelength channel of said detection system corresponds to a first diffraction order sub-beam at said second wavelength, and said position determining unit determines said position of said alignment mark based on said first and second wavelength signals with a first precision.

30. A lithographic apparatus according to claim 24, wherein said detection system further comprises a third signal channel at said first wavelength and a second diffraction order sub-beam at said first wavelength, and a fourth signal channel at said second wavelength and a second diffraction order sub-beam at said second wavelength, and said position determining unit determines said position of said alignment mark based on said first and second wavelength signals with a second precision that is more precise than said first precision.

31. A lithographic apparatus according to claim 24, wherein said first wavelength channel of said detection system corresponds to a first diffraction order sub-beam at said first wavelength, a value of said diffraction order sub-beam at said first wavelength being dynamically selected based on processing said substrate had undergone, and said second wavelength channel of said detection system corresponds to a first diffraction order sub-beam at said second wavelength, a value of said diffraction order sub-beam at said second wavelength being dynamically selected based on processing said substrate had undergone.

32. A lithographic apparatus according to claim 25, wherein said position determining unit processes said information from said first and second wavelength channels by further assigning a selectable parameter to combine information from said first and second wavelength signals.

33. A lithographic apparatus according to claim 32, wherein said selectable parameter eliminates information from said first wavelength signal from said position determination when said first wavelength signal fails to satisfy a selectable level of reliability.

34. A lithographic apparatus according to claim 32, wherein said selectable parameter eliminates information from said first wavelength signal from said position determination when said first wavelength signal fails to satisfy a selectable level of precision.

35. A lithographic apparatus according to claim 32, wherein said selectable parameter is determined prior to said assigning said weights.

36. A lithographic apparatus according to claim 32, wherein said selectable parameter is determined after to said assigning said weights.

37. A lithographic apparatus according to claim 25, wherein said weighting factors assigned to said first and second wavelength signals that depend on said first and second signal strengths further depend on a selectable threshold value, said weighting factors being constrained to be within a range from zero to one, inclusive.

38. A lithographic apparatus according to claim 37, wherein said weighting factors assigned to said first and second wavelength signals that depend on said first and second signal strengths further depend on a reflectivity of said substrate or a material on said substrate at each of said first and second wavelengths.

39. A lithographic apparatus according to claim 37, wherein said selectable threshold value is a relative threshold, relative to a selected value of a signal strength.

40. A lithographic apparatus according to claim 37, wherein said selectable threshold value is an absolute threshold.

41. A lithographic apparatus according to claim 39, wherein said weighting factors assigned to said first and second wavelength signals that depend on said first and second signal strengths further depend on a selectable absolute threshold value.

42. A lithographic apparatus according to claim 25, wherein said weighting factors assigned to said first and second wavelength signals are assigned such that said first wavelength signal is preferred over said second wavelength signal.

43. A lithographic apparatus according to claim 42, wherein said weighting factors of said first and second wavelength signals are reassigned such that said second wavelength signal is preferred over said first wavelength signal subsequent to said second wavelength signal dominating over said first wavelength signal when said weighting factors were previously assigned such that said first wavelength signal was preferred over said second wavelength signal, leading to a hysteresis effect.

44. A lithographic apparatus according to claim 42, wherein said weighting factors assigned to said first and second wavelength signals are reassigned such that said second wavelength signal is preferred over said first wavelength signal based on predetermined criteria.

45. A lithographic apparatus according to claim 24, wherein said position determining unit is constructed to assign weight factors to said first and second wavelength channels that depend on at least one measurable quantity selected from the set of measurable quantities consisting of mcc, minirepro, signal-to-noise ratio, signal shape, signal envelope, focus, tilt, order channels position offset, wavelength channels position offset, shift between segments and coarse-fine position deviation, wherein the parameter mcc is a multiple correlation coefficient indicating how well the measured signal resembles the signal expected for a perfect alignment mark, minirepro is a standard deviation of the aligned position of different sections or portions of an alignment measurement, indicating the accuracy of the aligned position, signal to noise ratio is the fitted signal divided by the relative level of noise across the spectrum of the measured signal, while the signal shape is the relative level of a few discrete frequencies in this spectrum, generally at multiples of the base frequency; the signal envelope is variance of the signal strength during the measurement, the focus is the offset in wafer height during the measurement, the tilt is the angle between the wafer angle and the detector angle during the measurement, order channels position offset is the measured difference in aligned position of the various channels of one wavelength, the wavelength channels position offset is the measured difference in aligned position of the various wavelength channels, the shift between segments is the measured difference in aligned position of the various segments of a multi segmented alignment mark, and the coarse-fine position deviation is the difference between the position of the alignment marks in the fine phase with respect to their expected position based on alignment mark measurements in the coarse phase.

46. A lithographic apparatus according to claim 25, wherein said weighting factors assigned to said first and second wavelength signals are selected in accordance with a diffraction order that is detected.

47. A method of detecting an alignment mark on a substrate, comprising:
 irradiating said alignment mark with alignment radiation that has at least two different illumination wavelengths;
 detecting radiation from said alignment mark at a first wavelength of said at least two different illumination wavelengths and outputting a first wavelength signal;
 detecting radiation from said alignment mark at a second wavelength of said at least two different illumination wavelengths and outputting a second wavelength signal; and
 determining a position of said alignment mark based on one of said first wavelength signal, said second wavelength signal and a combination of said first and second wavelength signals according to a relative strength of said first wavelength signal to said second wavelength signal.

48. A method of detecting an alignment mark on a substrate according to claim 47, further comprising:
 determining a first signal strength of said first signal; and
 determining a second signal strength of said second signal,
 wherein said determining a position of said alignment mark based on said first and second wavelength signals comprises assigning weighting factors to said first and second wavelength signals that depend on said first and second signal strengths.

49. A method of detecting an alignment mark on a substrate according to claim 47, wherein said detecting radiation from said alignment mark at said first wavelength of said at least two different illumination wavelengths comprises detecting a first diffraction order sub-beam at said first wavelength,
 said detecting radiation from said alignment mark at said second wavelength of said at least two different illumination wavelengths comprises detecting a first diffraction order sub-beam at said second wavelength, and
 said determining said position of said alignment mark based on said first and second wavelength signals comprises determining said position with a first precision.

50. A method of detecting an alignment mark on a substrate according to claim 49, wherein said detecting radiation from said alignment mark at said first wavelength of said at least two different illumination wavelengths comprises detecting a second diffraction order sub-beam at said first wavelength,
 said detecting radiation from said alignment mark at said second wavelength of said at least two different illumination wavelengths comprises detecting a second diffraction order sub-beam at said second wavelength, and
 said determining said position of said alignment mark based on said first and second wavelength signals comprises determining said position with a second precision that is more precise than said first precision.

51. A method of detecting an alignment mark on a substrate according to claim 47, wherein said detecting radiation from said alignment mark at said first wavelength of said at least two different illumination wavelengths comprises detecting a diffraction order sub-beam at said first wavelength, a value of said diffraction order sub-beam at said first wavelength being dynamically selected based on processing said substrate had undergone, and
 said detecting radiation from said alignment mark at said second wavelength of said at least two different illumination wavelengths comprises detecting a diffraction order sub-beam at said second wavelength, a value of said diffraction order sub-beam at said second wavelength being dynamically selected based on processing said substrate had undergone.

52. A method of detecting an alignment mark on a substrate according to claim 48, wherein said determining a position of said alignment mark based on said first and second wavelength signals further comprises assigning a selectable parameter to combine information from said first and second wavelength signals.

53. A method of detecting an alignment mark on a substrate according to claim 52, wherein said selectable parameter eliminates information from said first wavelength signal from said position determination when said first wavelength signal fails to satisfy a selectable level of reliability.

54. A method of detecting an alignment mark on a substrate according to claim 52, wherein said selectable parameter eliminates information from said first wavelength signal from said position determination when said first wavelength signal fails to satisfy a selectable level of precision.

55. A method of detecting an alignment mark on a substrate according to claim 52, wherein said selectable parameter is determined prior to said assigning said weights.

56. A method of detecting an alignment mark on a substrate according to claim 52, wherein said selectable parameter is determined after said assigning said weights.

57. A method of detecting an alignment mark on a substrate according to claim 48, wherein said weighting factors assigned to said first and second wavelength signals that depend on said first and second signal strengths further depend on a selectable threshold value, said weighting factors being constrained to be within a range from zero to one, inclusive.

58. A method of detecting an alignment mark on a substrate according to claim 57, wherein said weighting factors assigned to said first and second wavelength signals that depend on said first and second signal strengths further depend on a reflectivity of said substrate or a material on said substrate at each of said first and second wavelengths.

59. A method of detecting an alignment mark on a substrate according to claim 57, wherein said selectable threshold value is a relative threshold, relative to a selected value of a signal strength.

60. A method of detecting an alignment mark on a substrate according to claim 57, wherein said selectable threshold value is an absolute threshold.

61. A method of detecting an alignment mark on a substrate according to claim 59, wherein said weighting factors assigned to said first and second wavelength signals that depend on said first and second signal strengths further depend on a selectable absolute threshold value.

62. A method of detecting an alignment mark on a substrate according to claim 48, wherein said assigning weighting factors to said first and second wavelength signals are assigned such that said first wavelength signal is preferred over said second wavelength signal.

63. A method of detecting an alignment mark on a substrate according to claim 62, wherein said weighting factors to said first and second wavelength signals are reassigned such that said second wavelength signal is preferred over said first wavelength signal subsequent to said second wavelength signal dominating over said first wavelength signal when said weighting factors were previously assigned such that said first wavelength signal was preferred over said second wavelength signal, leading to a hysteresis effect.

64. A method of detecting an alignment mark on a substrate according to claim 62, wherein said assigning weighting factors to said first and second wavelength signals are reassigned such that said second wavelength signal is preferred over said first wavelength signal based on predetermined criteria.

65. A method of detecting an alignment mark on a substrate according to claim 47, further comprising:
determining a first signal strength of said first signal; and
determining a second signal strength of said second signal,
wherein said determining a position of said alignment mark based on said first and second wavelength signals comprises assigning weighting factors to said first and second wavelength signals that depend on at least one measurable quantity selected from the set of measurable quantities consisting of mcc, minirepro, signal-to-noise ratio, signal shape, signal envelope, focus, tilt, order channels position offset, wavelength channels position offset, shift between segments and coarse-fine position deviation,
wherein the parameter mcc is a multiple correlation coefficient indicating how well the measured signal resembles the signal expected for a perfect alignment mark, minirepro is a standard deviation of the aligned position of different sections or portions of an alignment measurement, indicating the accuracy of the aligned position, signal to noise ratio is the fitted signal divided by the relative level of noise across the spectrum of the measured signal, while the signal shape is the relative level of a few discrete frequencies in this spectrum, generally at multiples of the base frequency; the signal envelope is variance of the signal strength during the measurement, the focus is the offset in wafer height during the measurement, the tilt is the angle between the wafer angle and the detector angle during the measurement, order channels position offset is the measured difference in aligned position of the various channels of one wavelength, the wavelength channels position offset is the measured difference in aligned position of the various wavelength channels, the shift between segments is the measured difference in aligned position of the various segments of a multi segmented alignment mark, and the coarse-fine position deviation is the difference between the position of the alignment marks in the fine phase with respect to their expected position based on alignment mark measurements in the coarse phase.

66. A method of detecting an alignment mark on a substrate according to claim 48, wherein said weighting factors assigned to said first and second wavelength signals are selected in accordance with a diffraction order that is detected.

67. A method of determining an alignment grid on a substrate, comprising
irradiating a plurality of alignment marks with alignment radiation that has at least two different wavelengths;
detecting radiation from each of said plurality of alignment marks at a first wavelength of said at least two different illumination wavelengths;
detecting radiation from each of said plurality of alignment marks at a second wavelength of said at least two different illumination wavelengths; and
determining said alignment grid based on information from said detecting at said first and second illumination wavelengths.

68. A method of determining an alignment grid according to claim 67, wherein said detecting comprises detecting radiation from an alignment mark from said plurality of alignment marks at a first wavelength of said at least two different illumination wavelengths and outputting a first wavelength signal;
detecting radiation from said alignment mark at a second wavelength of said at least two different illumination wavelengths and outputting a second wavelength signal; and
determining alignment grid parameters based on at least said first and second wavelength signals.

69. A method of determining an alignment grid according to claim 68, further comprising:
determining a first signal strength of said first signal; and
determining a second signal strength of said second signal,
wherein said determining alignment grid parameters based on said first and second wavelength signals comprises assigning weighting factors to said first and second wavelength signals that depend on said first and second signal strengths.

70. A method of determining an alignment grid according to claim 68, wherein said detecting radiation from said alignment mark at said first wavelength of said at least two different illumination wavelengths comprises detecting a first diffraction order sub-beam at said first wavelength,
said detecting radiation from said alignment mark at said second wavelength of said at least two different illumination wavelengths comprises detecting a first diffraction order sub-beam at said second wavelength, and
said determining said alignment grid parameters based on said first and second wavelength signals comprises determining said alignment grid parameters with a first precision.

71. A method of determining an alignment grid according to claim 70, wherein said detecting radiation from said alignment mark at said first wavelength of said at least two different illumination wavelengths comprises detecting a second diffraction order sub-beam at said first wavelength,
said detecting radiation from said alignment mark at said second wavelength of said at least two different illumination wavelengths comprises detecting a second diffraction order sub-beam at said second wavelength, and
said determining said alignment grid parameters based on said first and second wavelength signals comprises determining said alignment grid parameters with a second precision that is more precise than said first precision.

72. A method of determining an alignment grid according to claim 68, wherein said detecting radiation from said alignment mark at said first wavelength of said at least two different illumination wavelengths comprises detecting a diffraction order sub-beam at said first wavelength, a value of said diffraction order sub-beam at said first wavelength being dynamically selected based on processing said substrate had undergone, and said detecting radiation from said alignment mark at said second wavelength of said at least two different illumination wavelengths comprises detecting a diffraction order sub-beam at said second wavelength, a value of said diffraction order sub-beam at said second wavelength being dynamically selected based on processing said substrate had undergone.

73. A method of determining an alignment grid according to claim 69, wherein said determining alignment grid parameters based on said first and second wavelength signals further comprises assigning a selectable parameter to combine information from said first and second wavelength signals.

74. A method of determining an alignment grid according to claim 73, wherein said selectable parameter eliminates information from said first wavelength signal from said determination of said alignment grid parameters when said first wavelength signal fails to satisfy a selectable level of reliability.

75. A method of determining an alignment grid according to claim 73, wherein said selectable parameter eliminates information from said first wavelength signal from said determination of said alignment grid parameters when said first wavelength signal fails to satisfy a selectable level of precision.

76. A method of determining an alignment grid according to claim 73, wherein said selectable parameter is determined prior to said assigning said weights.

77. A method of determining an alignment grid according to claim 73, wherein said selectable parameter is determined after said assigning said weights.

78. A method of determining an alignment grid according to claim 69, wherein said weighting factors assigned to said first and second wavelength signals that depend on said first and second signal strengths further depend on a selectable threshold value, said weighting factors being constrained to be within a range from zero to one, inclusive.

79. A method of determining an alignment grid according to claim 78, wherein said weighting factors assigned to said first and second wavelength signals that depend on said first and second signal strengths further depend on a reflectivity of said substrate or a material on said substrate at each of said first and second wavelengths.

80. A method of determining an alignment grid according to claim 78, wherein said selectable threshold value is a relative threshold, relative to a selected value of a signal strength.

81. A method of determining an alignment grid according to claim 78, wherein said selectable threshold value is an absolute threshold.

82. A method of determining an alignment grid according to claim 80, wherein said weighting factors assigned to said first and second wavelength signals that depend on said first and second signal strengths further depend on a selectable absolute threshold value.

83. A method of determining an alignment grid according to claim 69, wherein said assigning weighting factors to said first and second wavelength signals are assigned such that said first wavelength signal is preferred over said second wavelength signal.

84. A method of determining an alignment grid according to claim 83, wherein said weighting factors to said first and second wavelength signals are reassigned such that said second wavelength signal is preferred over said first wavelength signal subsequent to said second wavelength signal dominating over said first wavelength signal when said weighting factors were previously assigned such that said first wavelength signal was preferred over said second wavelength signal, leading to a hysteresis effect.

85. A method of determining an alignment grid according to claim 83, wherein said assigning weighting factors to said first and second wavelength signals are reassigned such that said second wavelength signal is preferred over said first wavelength signal based on predetermined criteria.

86. A method of determining an alignment grid according to claim 68, further comprising:

determining a first signal strength of said first signal; and determining a second signal strength of said second signal, wherein said determining alignment grid parameters based on said first and second wavelength signals comprises assigning weighting factors to said first and second wavelength signals that depend on at least one measurable quantity selected from the set of measurable quantities consisting of mcc, minirepro, signal-to-noise ratio, signal shape, signal envelope, focus, tilt, order channels position offset, wavelength channels position offset, shift between segments and coarse-fine position deviation, wherein the parameter mcc is a multiple correlation coefficient indicating how well the measured signal resembles the signal expected for a perfect alignment mark, minirepro is a standard deviation of the aligned position of different sections or portions of an alignment measurement, indicating the accuracy of the aligned position, signal to noise ratio is the fitted signal divided by the relative level of noise across the spectrum of the measured signal, while the signal shape is the relative level of a few discrete frequencies in this spectrum, generally at multiples of the base frequency; the signal envelope is variance of the signal strength during the measurement, the focus is the offset in wafer height during the measurement, the tilt is the angle between the wafer angle and the detector angle during the measurement, order channels position offset is the measured difference in aligned position of the various channels of one wavelength, the wavelength channels position offset is the measured difference in aligned position of the various wavelength channels, the shift between segments is the measured difference in aligned position of the various segments of a multi segmented alignment mark, and the coarse-fine position deviation is the difference between the position of the alignment marks in the fine phase with respect to their expected position based on alignment mark measurements in the coarse phase.

87. A method of determining an alignment grid according to claim 69, wherein said weighting factors assigned to said first and second wavelength signals are selected in accordance with a diffraction order that is detected.

88. A method of determining an alignment grid according to claim 68, further comprising using at least one of grid residuals, non-orthogonality, an X-Y expansion difference and wafer expansion in the said determination of said alignment grid, wherein grid residuals are the deviations from the measured alignment mark position to the fitted wafer grid, non-orthogonality and X-Y expansion difference are both measures of the deformation of the wafer, and wafer expansion is a measure of the expansion of the wafer.

89. A method of determining an alignment grid according to claim 68, further comprising storing information from said alignment grid parameters obtained for a first substrate.

90. A method of determining an alignment grid according to claim 89, further comprising retrieving said information from said alignment grid parameters obtained for a first substrate in said determining alignment grid parameters for a second substrate.

91. An alignment system for a lithographic apparatus, comprising:
    a source of alignment radiation having a first wavelength and a second wavelength;
    a detection system comprising a first wavelength channel arranged to receive alignment radiation from an alignment mark at said first wavelength and a second wavelength channel arranged to receive alignment radiation from said alignment mark at said second wavelength; and
    a position determining unit in communication with said detection system,
    wherein said position determining unit processes information from said first and second wavelength channels in combination to determine an alignment grid based on at least one of information from said first wavelength channel, information from said second wavelength channel and combined information from said first and second wavelength channels according to a relative strength of said alignment radiation detected at said first wavelength to alignment radiation detected at said second wavelength.

92. An alignment system according to claim 91, wherein said position determining unit is constructed to process said information from said first and second wavelength channels by weighting first and second signals from said first and second wavelength channels with factors that depend on a relative strength of said first signal to said second signal.

93. An alignment system according to claim 92, wherein the weight factor for said second wavelength channel is set to zero when a strength of said first signal relative to said second signal exceeds a predetermined threshold.

94. An alignment system according to claim 91, wherein said source of alignment radiation comprises a first laser that generates radiation at said first wavelength and a second laser that generates radiation at said second wavelength.

95. An alignment system according to claim 91, wherein said position determining unit is constructed to assign weight factors to said first and second wavelength channels that depend on signal strengths of said first and second wavelength signals.

96. An alignment system according to claim 91, wherein said first wavelength channel of said detection system corresponds to a first diffraction order sub-beam at said first wavelength,
    said second wavelength channel of said detection system corresponds to a first diffraction order sub-beam at said second wavelength, and
    said position determining unit determines said alignment grid based on said first and second wavelength signals with a first precision.

97. An alignment system according to claim 91, wherein said detection system further comprises a third signal channel at said first wavelength and a second diffraction order sub-beam at said first wavelength, and a fourth signal channel at said second wavelength and a second diffraction order sub-beam at said second wavelength, and
    said position determining unit determines said alignment grid based on said first and second wavelength signals with a second precision that is more precise than said first precision.

98. An alignment system according to claim 91, wherein said first wavelength channel of said detection system corresponds to a first diffraction order sub-beam at said first wavelength, a value of said diffraction order sub-beam at said first wavelength being dynamically selected based on processing said substrate had undergone, and
    said second wavelength channel of said detection system corresponds to a first diffraction order sub-beam at said second wavelength, a value of said diffraction order sub-beam at said second wavelength being dynamically selected based on processing said substrate had undergone.

99. An alignment system according to claim 92, wherein said position determining unit processes said information from said first and second wavelength channels by further assigning a selectable parameter to combine information from said first and second wavelength signals.

100. An alignment system according to claim 99, wherein said selectable parameter eliminates information from said first wavelength signal from said position determination when said first wavelength signal fails to satisfy a selectable level of reliability.

101. An alignment system according to claim 99, wherein said selectable parameter eliminates information from said first wavelength signal from said position determination when said first wavelength signal fails to satisfy a selectable level of precision.

102. An alignment system according to claim 99, wherein said selectable parameter is determined prior to said assigning said weights.

103. An alignment system according to claim 99, wherein said selectable parameter is determined after to said assigning said weights.

104. An alignment system according to claim 92, wherein said weighting factors assigned to said first and second wavelength signals that depend on said first and second signal strengths further depend on a selectable threshold value, said weighting factors being constrained to be within a range from zero to one, inclusive.

105. An alignment system according to claim 104, wherein said weighting factors assigned to said first and second wavelength signals that depend on said first and second signal strengths further depend on a reflectivity of said substrate or a material on said substrate at each of said first and second wavelengths.

106. An alignment system according to claim 104, wherein said selectable threshold value is a relative threshold, relative to a selected value of a signal strength.

107. An alignment system according to claim 104, wherein said selectable threshold value is an absolute threshold.

108. An alignment system according to claim 106, wherein said weighting factors assigned to said first and second wavelength signals that depend on said first and second signal strengths further depend on a selectable absolute threshold value.

109. An alignment system according to claim 92, wherein said weighting factors assigned to said first and second wavelength signals are assigned such that said first wavelength signal is preferred over said second wavelength signal.

110. An alignment system according to claim 109, wherein said weighting factors of said first and second wavelength signals are reassigned such that said second wavelength signal is preferred over said first wavelength signal subsequent to said second wavelength signal dominating over said first wavelength signal when said weighting factors were previously assigned such that said first wavelength signal was preferred over said second wavelength signal, leading to a hysteresis effect.

111. An alignment system according to claim 109, wherein said weighting factors assigned to said first and second wavelength signals are reassigned such that said second wavelength signal is preferred over said first wavelength signal based on predetermined criteria.

112. An alignment system according to claim 91, wherein said position determining unit is constructed to process said information from said first and second wavelength channels by weighting first and second signals from said first and second wavelength channels with factors that depend on at least one measurable quantity selected from the set of measurable quantities consisting of mcc, minirepro, signal-to-noise ratio, signal shape, signal envelope, focus, tilt, order channels position offset, wavelength channels position offset, shift between segments and coarse-fine position deviation, wherein the parameter mcc is a multiple correlation coefficient indicating how well the measured signal resembles the signal expected for a perfect alignment mark, minirepro is a standard deviation of the aligned position of different sections or portions of an alignment measurement, indicating the accuracy of the aligned position, signal to noise ratio is the fitted signal divided by the relative level of noise across the spectrum of the measured signal, while the signal shape is the relative level of a few discrete frequencies in this spectrum, generally at multiples of the base frequency; the signal envelope is variance of the signal strength during the measurement, the focus is the offset in wafer height during the measurement, the tilt is the angle between the wafer angle and the detector angle during the measurement, order channels position offset is the measured difference in aligned position of the various channels of one wavelength, the wavelength channels position offset is the measured difference in aligned position of the various wavelength channels, the shift between segments is the measured difference in aligned position of the various segments of a multi segmented alignment mark, and the coarse-fine position deviation is the difference between the position of the alignment marks in the fine phase with respect to their expected position based on alignment mark measurements in the coarse phase.

113. An alignment system according to claim 92, wherein said weighting factors assigned to said first and second wavelength signals are selected in accordance with a diffraction order that is detected.

114. A lithographic apparatus, comprising:
an illumination system;
a substrate stage assembly arranged in a radiation path of said source of illumination radiation;
a reticle stage assembly arranged in said radiation path of said source of illumination radiation between said source and said substrate stage assembly;
a projection system arranged between said reticle stage assembly and said substrate stage assembly; and
an alignment system arranged adjacent to said projection system and proximate said substrate stage assembly, wherein said alignment system comprises:
a source of alignment radiation having a first wavelength and a second wavelength;
a detection system comprising a first wavelength channel arranged to receive alignment radiation from an alignment mark at said first wavelength and a second wavelength channel arranged to receive alignment radiation from said alignment mark at said second wavelength channel; and
a position determining unit in communication with said detection system,
wherein said position determining unit processes information from said first and second wavelength channels in combination to determine an alignment grid based on one of information from said first wavelength channel, information from said second wavelength channel and combined information from said first and second wavelength channels according to a relative strength of said alignment radiation detected at said first wavelength to alignment radiation detected at said second wavelength.

115. A lithographic apparatus according to claim 114, wherein said position determining unit is constructed to process said information from said first and second wavelength channels by weighting first and second signals from said first and second wavelength channels with factors that depend on the relative strength of said first signal to said second signal.

116. A lithographic apparatus according to claim 115, wherein the weight factor for said second channel is set to zero when a strength of said first signal relative to said second signal exceeds a predetermined threshold.

117. A lithographic apparatus according to claim 114, wherein said source of alignment radiation comprises a first laser that generates radiation at a first wavelength and a second laser that generates radiation at a second wavelength.

118. A lithographic apparatus according to claim 114, wherein said position determining unit is constructed to assign weight factors to said first and second wavelength channels that depend on signal strengths of said first and second wavelength signals.

119. A lithographic apparatus according to claim 114, wherein said first wavelength channel of said detection system corresponds to a first diffraction order sub-beam at said first wavelength,
said second wavelength channel of said detection system corresponds to a first diffraction order sub-beam at said second wavelength, and
said position determining unit determines said alignment grid based on said first and second wavelength signals with a first precision.

120. A lithographic apparatus according to claim 114, wherein said detection system further comprises a third signal channel at said first wavelength and a second diffraction order sub-beam at said first wavelength, and a fourth signal channel at said second wavelength and a second diffraction order sub-beam at said second wavelength, and
said position determining unit determines said alignment grid based on said first and second wavelength signals with a second precision that is more precise than said first precision.

121. A lithographic apparatus according to claim 114, wherein said first wavelength channel of said detection system corresponds to a first diffraction order sub-beam at said first wavelength, a value of said diffraction order sub-beam at said first wavelength being dynamically selected based on processing said substrate had undergone, and said second wavelength channel of said detection system corresponds to a first diffraction order sub-beam at said second wavelength, a value of said diffraction order sub-beam at said second wavelength being dynamically selected based on processing said substrate had undergone.

122. A lithographic apparatus according to claim 115, wherein said position determining unit processes said information from said first and second wavelength channels by further assigning a selectable parameter to combine information from said first and second wavelength signals.

123. A lithographic apparatus according to claim 122, wherein said selectable parameter eliminates information from said first wavelength signal from said position determination when said first wavelength signal fails to satisfy a selectable level of reliability.

124. A lithographic apparatus according to claim 122, wherein said selectable parameter eliminates information from said first wavelength signal from said determination of said alignment grid when said first wavelength signal fails to satisfy a selectable level of precision.

125. A lithographic apparatus according to claim 122, wherein said selectable parameter is determined prior to said assigning said weights.

126. A lithographic apparatus according to claim 122, wherein said selectable parameter is determined after to said assigning said weights.

127. A lithographic apparatus according to claim 115, wherein said weighting factors assigned to said first and second wavelength signals that depend on said first and second signal strengths further depend on a selectable threshold value, said weighting factors being constrained to be within a range from zero to one, inclusive.

128. A lithographic apparatus according to claim 127, wherein said weighting factors assigned to said first and second wavelength signals that depend on said first and second signal strengths further depend on a reflectivity of said substrate or a material on said substrate at each of said first and second wavelengths.

129. A lithographic apparatus according to claim 127, wherein said selectable threshold value is a relative threshold, relative to a selected value of a signal strength.

130. A lithographic apparatus according to claim 127, wherein said selectable threshold value is an absolute threshold.

131. A lithographic apparatus according to claim 129, wherein said weighting factors assigned to said first and second wavelength signals that depend on said first and second signal strengths further depend on a selectable absolute threshold value.

132. A lithographic apparatus according to claim 115, wherein said weighting factors assigned to said first and second wavelength signals are assigned such that said first wavelength signal is preferred over said second wavelength signal.

133. A lithographic apparatus according to claim 132, wherein said weighting factors of said first and second wavelength signals are reassigned such that said second wavelength signal is preferred over said first wavelength signal subsequent to said second wavelength signal dominating over said first wavelength signal when said weighting factors were previously assigned such that said first wavelength signal was preferred over said second wavelength signal, leading to a hysteresis effect.

134. A lithographic apparatus according to claim 132, wherein said weighting factors assigned to said first and second wavelength signals are reassigned such that said second wavelength signal is preferred over said first wavelength signal based on predetermined criteria.

135. A lithographic apparatus according to claim 114, wherein said position determining unit is constructed to assign weight factors to said first and second wavelength channels that depend on at least one measurable quantity selected from the set of measurable quantities consisting of mcc, minirepro, signal-to-noise ratio, signal shape, signal envelope, focus, tilt, order channels position offset, wavelength channels position offset, shift between segments and coarse-fine position deviation, wherein the parameter mcc is a multiple correlation coefficient indicating how well the measured signal resembles the signal expected for a perfect alignment mark, minirepro is a standard deviation of the aligned position of different sections or portions of an alignment measurement, indicating the accuracy of the aligned position, signal to noise ratio is the fitted signal divided by the relative level of noise across the spectrum of the measured signal, while the signal shape is the relative level of a few discrete frequencies in this spectrum, generally at multiples of the base frequency; the signal envelope is variance of the signal strength during the measurement, the focus is the offset in wafer height during the measurement, the tilt is the angle between the wafer angle and the detector angle during the measurement, order channels position offset is the measured difference in aligned position of the various channels of one wavelength, the wavelength channels position offset is the measured difference in aligned position of the various wavelength channels, the shift between segments is the measured difference in aligned position of the various segments of a multi segmented alignment mark, and the coarse-fine position deviation is the difference between the position of the alignment marks in the fine phase with respect to their expected position based on alignment mark measurements in the coarse phase.

136. A lithographic apparatus according to claim 115, wherein said weighting factors assigned to said first and second wavelength signals are selected in accordance with a diffraction order that is detected.

137. A lithographic apparatus, comprising:
an illumination system; a substrate stage assembly moveable between a radiation path of illumination radiation from said illumination system and a measurement location;
a reticle stage assembly arranged in said radiation path of said illumination radiation between said illumination system and said substrate stage assembly;
a projection system arranged between said reticle stage assembly and said substrate stage assembly; and
an alignment system located in said measurement location so as to be proximate said substrate stage assembly when said substrate stage assembly is in said measurement location,
wherein said alignment system comprises:
a source of alignment radiation having a first wavelength and a second wavelength;
a detection system comprising a first wavelength channel arranged to receive alignment radiation from an alignment mark at said first wavelength and a second wavelength channel arranged to receive alignment radiation from said alignment mark at said second wavelength channel; and
a position determining unit in communication with said detection system, wherein said position determining unit processes information from said first and second wavelength channels in combination to determine a position of said alignment mark based on one of information from said first wavelength channel, information from said second wavelength channel and combined information from said first and second wavelength channels according to a relative strength of said alignment radiation detected at said first wavelength to alignment radiation detected at said second wavelength.

* * * * *